(12) United States Patent
Haba et al.

(10) Patent No.: US 12,713,942 B2
(45) Date of Patent: Aug. 18, 2026

(54) CHIPLET-TO-CHIPLET PROTOCOL SWITCH

(71) Applicant: ADEIA SEMICONDUCTOR BONDING TECHNOLOGIES INC., San Jose, CA (US)

(72) Inventors: Belgacem Haba, Saratoga, CA (US); Rajesh Katkar, Milpitas, CA (US); Abul Nuruzzaman, Saratoga, CA (US)

(73) Assignee: Adeia Semiconductor Bonding Technologies Inc., San Jose, CA (US)

( * ) Notice: Subject to any disclaimer, the term of this patent is extended or adjusted under 35 U.S.C. 154(b) by 393 days.

(21) Appl. No.: 18/345,867

(22) Filed: Jun. 30, 2023

(65) Prior Publication Data

US 2025/0006642 A1 Jan. 2, 2025

(51) Int. Cl.

| | |
|---|---|
| ***H10W 70/60*** | (2026.01) |
| ***H10W 74/00*** | (2026.01) |
| ***H10W 90/00*** | (2026.01) |

(52) U.S. Cl.

CPC .......... *H10W 70/60* (2026.01); *H10W 70/611* (2026.01); *H10W 90/00* (2026.01); *H10W 74/00* (2026.01); *H10W 90/794* (2026.01)

(58) Field of Classification Search

CPC ... H01L 23/538; H01L 24/08; H01L 25/0655; H01L 2224/08238; H01L 2924/182; H01L 24/80; H01L 25/18; H01L 25/50

See application file for complete search history.

(56) References Cited

U.S. PATENT DOCUMENTS

| | | | |
|---|---|---|---|
| 5,753,536 | A | 5/1998 | Sugiyama et al. |
| 5,771,555 | A | 6/1998 | Eda et al. |

(Continued)

FOREIGN PATENT DOCUMENTS

| | | | |
|---|---|---|---|
| CN | 111477612 | A | 7/2020 |
| CN | 211929489 | U | 11/2020 |

(Continued)

OTHER PUBLICATIONS

AEHR Test Systems, “FOX™ WaferPak Contactor—Single Touch-down Full-Wafer Test & Burn-in”, Publication 4083047601 RevC, (2028) downloaded from https://www.aehr.com/wp-content/uploads/2023/09/FOX-WaferPak-3.2.18.pdf in 1 page.

(Continued)

*Primary Examiner* — Thanh Y. Tran

(74) *Attorney, Agent, or Firm* — Knobbe, Martens, Olson & Bear, LLP

(57) ABSTRACT

A bonded structure is disclosed. The bonded structure can include a carrier. The bonded structure can include a first die having a first communications circuitry to format a communication signal according to a first communication protocol and to transmit the communication signal. The bonded structure can also include a protocol switch die having circuitry to receive the communications signal and to convert the communication signal from the first communication protocol to a second communication protocol, wherein the second communication protocol is different from the first communication protocol. The protocol switch die can transmit the communication signal according to the second communication protocol. The bonded structure can also include a second die having a second communications circuitry to receive the communication signal formatted in the second communication protocol.

20 Claims, 8 Drawing Sheets

(56) References Cited

U.S. PATENT DOCUMENTS 6,080,640 A 6/2000 Gardner et al.
6,423,640 B1 7/2002 Lee et al.
6,465,892 B1 10/2002 Suga
6,675,469 B1 1/2004 Haba et al.
6,887,769 B2 5/2005 Kellar et al.
6,908,027 B2 6/2005 Tolchinsky et al.
7,045,453 B2 5/2006 Canaperi et al.
7,105,980 B2 9/2006 Abbott et al.
7,193,423 B1 3/2007 Dalton et al.
7,660,776 B1 2/2010 Kious
7,750,488 B2 7/2010 Patti et al.
7,803,693 B2 9/2010 Trezza
8,183,127 B2 5/2012 Patti et al.
8,349,635 B1 1/2013 Gan et al.
8,377,798 B2 2/2013 Peng et al.
8,441,131 B2 5/2013 Ryan
8,476,165 B2 7/2013 Trickett et al.
8,482,132 B2 7/2013 Yang et al.
8,501,537 B2 8/2013 Sadaka et al.
8,524,533 B2 9/2013 Tong et al.
8,566,612 B2 10/2013 Davis et al.
8,620,164 B2 12/2013 Heck et al.
8,647,987 B2 2/2014 Yang et al.
8,697,493 B2 4/2014 Sadaka
8,716,105 B2 5/2014 Sadaka et al.
8,802,538 B1 8/2014 Liu
8,809,123 B2 8/2014 Liu et al.
8,841,002 B2 9/2014 Tong
9,093,350 B2 7/2015 Endo et al.
9,142,517 B2 9/2015 Liu et al.
9,171,756 B2 10/2015 Enquist et al.
9,184,125 B2 11/2015 Enquist et al.
9,224,704 B2 12/2015 Landru
9,230,941 B2 1/2016 Chen et al.
9,257,399 B2 2/2016 Kuang et al.
9,299,736 B2 3/2016 Chen et al.
9,312,229 B2 4/2016 Chen et al.
9,331,149 B2 5/2016 Tong et al.
9,337,235 B2 5/2016 Chen et al.
9,385,024 B2 7/2016 Tong et al.
9,394,161 B2 7/2016 Cheng et al.
9,431,368 B2 8/2016 Enquist et al.
9,437,572 B2 9/2016 Chen et al.
9,443,796 B2 9/2016 Chou et al.
9,461,007 B2 10/2016 Chun et al.
9,496,239 B1 11/2016 Edelstein et al.
9,536,848 B2 1/2017 England et al.
9,559,081 B1 1/2017 Lai et al.
9,620,481 B2 4/2017 Edelstein et al.
9,656,852 B2 5/2017 Cheng et al.
9,723,716 B2 8/2017 Meinhold
9,728,521 B2 8/2017 Tsai et al.
9,741,620 B2 8/2017 Uzoh et al.
9,799,587 B2 10/2017 Fujii et al.
9,852,988 B2 12/2017 Enquist et al.
9,893,004 B2 2/2018 Yazdani
9,899,442 B2 2/2018 Katkar
9,929,050 B2 3/2018 Lin
9,941,241 B2 4/2018 Edelstein et al.
9,941,243 B2 4/2018 Kim et al.
9,953,941 B2 4/2018 Enquist
9,960,142 B2 5/2018 Chen et al.
10,002,844 B1 6/2018 Wang et al.
10,026,605 B2 7/2018 Doub et al.
10,075,657 B2 9/2018 Fahim et al.
10,204,893 B2 2/2019 Uzoh et al.
10,269,756 B2 4/2019 Uzoh
10,276,619 B2 4/2019 Kao et al.
10,276,909 B2 4/2019 Huang et al.
10,418,277 B2 9/2019 Cheng et al.
10,446,456 B2 10/2019 Shen et al.
10,446,487 B2 10/2019 Huang et al.
10,446,532 B2 10/2019 Uzoh et al.
10,508,030 B2 12/2019 Katkar et al.
10,522,499 B2 12/2019 Enquist et al.
10,637,233 B2 4/2020 Hao
10,707,087 B2 7/2020 Uzoh et al.
10,784,191 B2 9/2020 Huang et al.
10,790,262 B2 9/2020 Uzoh et al.
10,840,135 B2 11/2020 Uzoh
10,840,205 B2 11/2020 Fountain, Jr. et al.
10,854,578 B2 12/2020 Morein
10,879,212 B2 12/2020 Uzoh et al.
10,886,177 B2 1/2021 DeLaCruz et al.
10,892,246 B2 1/2021 Uzoh
10,923,408 B2 2/2021 Huang et al.
10,923,413 B2 2/2021 DeLaCruz
10,950,547 B2 3/2021 Mohammed et al.
10,964,664 B2 3/2021 Mandalapu et al.
10,985,133 B2 4/2021 Uzoh
10,991,804 B2 4/2021 DeLaCruz et al.
10,998,292 B2 5/2021 Lee et al.
11,004,757 B2 5/2021 Katkar et al.
11,011,494 B2 5/2021 Gao et al.
11,011,503 B2 5/2021 Wang et al.
11,031,285 B2 6/2021 Katkar et al.
11,037,919 B2 6/2021 Uzoh et al.
11,056,348 B2 7/2021 Theil
11,069,734 B2 7/2021 Katkar
11,088,099 B2 8/2021 Katkar et al.
11,127,738 B2 9/2021 DeLaCruz et al.
11,158,573 B2 10/2021 Uzoh et al.
11,158,606 B2 10/2021 Gao et al.
11,169,326 B2 11/2021 Huang et al.
11,171,117 B2 11/2021 Gao et al.
11,176,450 B2 11/2021 Teig et al.
11,195,748 B2 12/2021 Uzoh et al.
11,205,625 B2 12/2021 DeLaCruz et al.
11,244,920 B2 2/2022 Uzoh
11,256,004 B2 2/2022 Haba et al.
11,264,357 B1 3/2022 DeLaCruz et al.
11,276,676 B2 3/2022 Enquist et al.
11,296,044 B2 4/2022 Gao et al.
11,296,053 B2 4/2022 Uzoh et al.
11,329,034 B2 5/2022 Tao et al.
11,348,898 B2 5/2022 DeLaCruz et al.
11,355,404 B2 6/2022 Gao et al.
11,355,443 B2 6/2022 Huang et al.
11,367,652 B2 6/2022 Uzoh et al.
11,373,963 B2 6/2022 DeLaCruz et al.
11,380,597 B2 7/2022 Katkar et al.
11,385,278 B2 7/2022 DeLaCruz et al.
11,387,202 B2 7/2022 Haba et al.
11,387,214 B2 7/2022 Wang et al.
11,393,779 B2 7/2022 Gao et al.
11,462,419 B2 10/2022 Haba
11,476,213 B2 10/2022 Haba et al.
11,500,010 B2 11/2022 Rowling et al.
11,515,291 B2 11/2022 DeLaCruz et al.
11,610,846 B2 3/2023 Haba et al.
11,728,287 B2 8/2023 DeLaCruz et al.
11,848,284 B2 12/2023 DeLaCruz et al.
2003/0221152 A1 11/2003 Volkerink et al.
2004/0084414 A1 5/2004 Sakai et al.
2004/0175850 A1 9/2004 Shimizu et al.
2006/0057945 A1 3/2006 Hsu et al.
2007/0111386 A1 5/2007 Kim et al.
2008/0088996 A1 4/2008 Bonvalot et al.
2014/0175655 A1 6/2014 Chen et al.
2014/0264739 A1 9/2014 Morrow et al.
2015/0046612 A1 2/2015 Gupta
2015/0064498 A1 3/2015 Tong
2016/0343682 A1 11/2016 Kawasaki
2017/0047260 A1 2/2017 Huang et al.
2018/0106851 A1 4/2018 Schweitzer et al.
2018/0151247 A1 5/2018 Sato
2018/0175012 A1 6/2018 Wu et al.
2018/0182639 A1 6/2018 Uzoh et al.
2018/0182666 A1 6/2018 Uzoh et al.
2018/0190580 A1 7/2018 Haba et al.
2018/0190583 A1 7/2018 DeLaCruz et al.
2018/0219038 A1 8/2018 Gambino et al.
2018/0323177 A1 11/2018 Yu et al.
2018/0323227 A1 11/2018 Zhang et al.

(56) References Cited

U.S. PATENT DOCUMENTS

2018/0331066 A1 11/2018 Uzoh et al.
2019/0115277 A1 4/2019 Yu et al.
2019/0131277 A1 5/2019 Yang et al.
2019/0170814 A1 6/2019 Yun
2019/0179785 A1* 6/2019 Keeth ................ H01L 23/5385
2019/0333550 A1 10/2019 Fisch
2019/0385935 A1 12/2019 Gao et al.
2020/0013765 A1 1/2020 Fountain, Jr. et al.
2020/0035641 A1 1/2020 Fountain, Jr. et al.
2020/0091115 A1 3/2020 Wu et al.
2020/0133902 A1 4/2020 Tang et al.
2020/0294908 A1 9/2020 Haba et al.
2020/0328162 A1 10/2020 Haba et al.
2020/0395321 A1 12/2020 Katkar et al.
2021/0098412 A1 4/2021 Haba et al.
2021/0118864 A1 4/2021 DeLaCruz et al.
2021/0143125 A1 5/2021 DeLaCruz et al.
2021/0181510 A1 6/2021 Katkar et al.
2021/0193603 A1 6/2021 DeLaCruz et al.
2021/0193624 A1 6/2021 DeLaCruz et al.
2021/0193625 A1 6/2021 Katkar et al.
2021/0242152 A1 8/2021 Fountain, Jr. et al.
2021/0265313 A1 8/2021 Chen et al.
2021/0296282 A1 9/2021 Gao et al.
2021/0305202 A1 9/2021 Uzoh et al.
2021/0366820 A1 11/2021 Uzoh
2021/0407941 A1 12/2021 Haba
2022/0077063 A1 3/2022 Haba
2022/0077087 A1 3/2022 Haba
2022/0102224 A1 3/2022 An et al.
2022/0139867 A1 5/2022 Uzoh
2022/0139869 A1 5/2022 Gao et al.
2022/0208650 A1 6/2022 Gao et al.
2022/0208702 A1 6/2022 Uzoh
2022/0208723 A1 6/2022 Katkar et al.
2022/0237138 A1 7/2022 Lanka et al.
2022/0246497 A1 8/2022 Fountain, Jr. et al.
2022/0285303 A1 9/2022 Mirkarimi et al.
2022/0318111 A1 10/2022 Choudhary et al.
2022/0319901 A1 10/2022 Suwito et al.
2022/0320035 A1 10/2022 Uzoh et al.
2022/0320036 A1 10/2022 Gao et al.
2023/0005850 A1 1/2023 Fountain, Jr.
2023/0019869 A1 1/2023 Mirkarimi et al.
2023/0036441 A1 2/2023 Haba et al.
2023/0067677 A1 3/2023 Lee et al.
2023/0069183 A1 3/2023 Haba
2023/0100032 A1 3/2023 Haba et al.
2023/0115122 A1 4/2023 Uzoh et al.
2023/0122531 A1 4/2023 Uzoh
2023/0123423 A1 4/2023 Gao et al.
2023/0125395 A1 4/2023 Gao et al.
2023/0130259 A1 4/2023 Haba et al.
2023/0132632 A1 5/2023 Katkar et al.
2023/0140107 A1 5/2023 Uzoh et al.
2023/0142680 A1 5/2023 Guevara et al.
2023/0154816 A1 5/2023 Haba et al.
2023/0154828 A1 5/2023 Haba et al.
2023/0187264 A1 6/2023 Uzoh et al.
2023/0187317 A1 6/2023 Uzoh
2023/0187412 A1 6/2023 Gao et al.
2023/0197453 A1 6/2023 Fountain, Jr. et al.
2023/0197496 A1 6/2023 Theil
2023/0197559 A1 6/2023 Haba et al.
2023/0197560 A1 6/2023 Katkar et al.
2023/0197655 A1 6/2023 Theil et al.
2023/0207402 A1 6/2023 Fountain, Jr. et al.
2023/0207437 A1 6/2023 Haba
2023/0207474 A1 6/2023 Uzoh et al.
2023/0207514 A1 6/2023 Gao et al.
2023/0215836 A1 7/2023 Haba et al.
2023/0245950 A1 8/2023 Haba et al.
2023/0268300 A1 8/2023 Uzoh et al.
2023/0343734 A1 10/2023 Uzoh et al.
2023/0360950 A1 11/2023 Gao
2023/0361074 A1 11/2023 Uzoh et al.
2023/0369136 A1 11/2023 Uzoh et al.
2023/0375613 A1 11/2023 Haba et al.
2024/0038702 A1 2/2024 Uzoh
2024/0055407 A1 2/2024 Workman
2024/0079376 A1 3/2024 Suwito et al.
2024/0105674 A1 3/2024 Uzoh et al.
2024/0170411 A1 5/2024 Chang et al.
2024/0186248 A1 6/2024 Haba et al.
2024/0186268 A1 6/2024 Uzoh et al.
2024/0186269 A1 6/2024 Haba
2024/0203917 A1 6/2024 Katkar et al.
2024/0213191 A1 6/2024 Theil et al.
2024/0213210 A1 6/2024 Haba et al.
2024/0217210 A1 7/2024 Zhao et al.
2024/0222239 A1 7/2024 Gao et al.
2024/0222315 A1 7/2024 Uzoh
2024/0222319 A1 7/2024 Gao et al.
2024/0266255 A1 8/2024 Haba et al.
2024/0298454 A1 9/2024 Haba
2024/0304593 A1 9/2024 Uzoh
2024/0312951 A1 9/2024 Theil et al.
2024/0332184 A1 10/2024 Katkar et al.
2024/0332227 A1 10/2024 Uzoh et al.
2024/0332231 A1 10/2024 Uzoh
2024/0332267 A1 10/2024 Haba et al.

FOREIGN PATENT DOCUMENTS

JP 2013-033786 A 2/2013
JP 2018-160519 10/2018
KR 10-2020-0002557 1/2020
WO WO 2005/043584 A2 5/2005
WO WO 2021/198009 A1 10/2021

OTHER PUBLICATIONS

"Built-In Self-Test (BiST)," On-chip logic to test a design, Semiconductor Engineering, https://semiengineering.com/knowledge_centers/test/built-in-self-test-bist/, printed Aug. 14, 2023, 3 pages.

Bush, Steve, "Electronica: Automotive power modules from On Semi," ElectronicsWeekly.com, indicating an Onsemi AR0820 product was to be demonstrated at a Nov. 2018 trade show, https://www.electronicsweekly.com/news/products/power-supplies/electronica-automotive-power-modules-semi-2018-11/ (published Nov. 8, 2018; downloaded Jul. 26, 2023).

Campbell, Richard, "What Is Built-In Self Test And Why Do We Need It? " Evaluation Engineering, Mar. 1, 1996, 20 pages.

"Companies Review Costs to Update Working Capital Plans amid COVID-19 Crisis," Chiplets Market, Chiplets Market (Application: Microprocessors [MPUs], System-on-Chip [SOC] Device, Graphic Processing Units [GPUs], Programmable Logic Devices [PLDs], and Others; and End-use Industry; Automotive Electronics, Consumer Electronics, Industrial Automation, Healthcare, Military, IT & Telecommunication, and Others)—Global Industry Analysis, Size, Share, Growth, Trends, and Forecast, 2021-2031, Transparency Market Research, https://www.transparencymarketresearch.com/chiplets-market.html, printed Aug. 14, 2023, 7 pages.

Feige, C. et al., "Logic BIST technology evaluation: an industrial case study," European Test Workshop-Informal Digest, 2001, pp. 333-340.

Formfactor® Case Study "Radar IC Manufacturer Cuts Testing Time in Half, Regardless of Elevated Temperatures, Using InfinityQuad Probes," Danube Integrated Circuit Engineering (DICE); (2022) in 4 pages.

Kim B.H. et al., "A Robust MEMS Probe Card with Vertical Guide for a Fine Pitch Test," J. Micromech. Microeng. Jun. 11, 2007;17(7): 1350-1359.

Morrison, Jim et al., "Samsung Galaxy S7 Edge Teardown," Tech Insights (posted Apr. 24, 2016), includes description of hybrid bonded Sony IMX260 dual-pixel sensor, https://www.techinsights.com/blog/samsung-galaxy-s7-edge-teardown, downloaded Jul. 11, 2023, 9 pages.

(56) References Cited

OTHER PUBLICATIONS

Nan, Li et al., "Logic BIST: State-of-the-Art and Open Problems," arXiv preprint arXiv: 1503.04628, 2015, 6 pages.
Onsemi AR0820 image, cross section of a CMOS image sensor product. The part in the image was shipped on Sep. 16, 2021. Applicant makes no representation that the part in the image is identical to the part identified in the separately submitted reference BUSH, Nov. 8, 2018, ElectronicsWeekly.com ("BUSH article"); however, the imaged part and the part shown in the BUSH article share the part number "ONSEMI AR0820.".
Rayming Technologies., "Top Aviation Engineering Services Companies in the World and What they Offer," downloaded from https://www.raypcb.com/aviation-engineering-services/; (2023) in 10 pages.
Sony IMX260 image, cross section of Sony dual-pixel sensor product labeled IMX260, showing peripheral probe and wire bond pads in a bonded structure. The part in the image was shipped in Apr. 2016. Applicant makes no representation that the part in the image is identical to the part identified in the separately submitted reference Morrison et al. (Tech Insights article dated Apr. 24, 2016), describing and showing a similar sensor product within the Samsung Galaxy S7; however the imaged part and the part shown in the Morrison et al. article share the part name "Sony IMX260.".
Vranken, Harald et al., "Impact of test point insertion on silicon area and timing during layout," Proceedings of the conference on Design, automation and test in Europe, Feb. 2004, vol. 2, 7 pages.
International Search Report and Written Opinion mailed Oct. 15, 2024, International Application No. PCT/US2024/035298, 15 pages.
Ker, Ming-Dou et al., "Fully process-compatible layout design on bond pad to improve wire bond reliability in CMOS Ics," IEEE Transactions on Components and Packaging Technologies, Jun. 2002, vol. 25, No. 2, pp. 309-316.
Moriceau, H. et al., "Overview of recent direct wafer bonding advances and applications," Advances in Natural Sciences-Nanoscience and Nanotechnology, 2010, 11 pages.
Nakanishi, H et al., "Studies on SiO2-SiO2 bonding with hydrofluoric acid. Room temperature and low stress bonding technique for MEMS," Sensors and Actuators, 2000, vol. 79, pp. 237-244.
Oberhammer, J et al., "Sealing of adhesive bonded devices on wafer level," Sensors and Actuators A, 2004, vol. 110, No. 1-3, pp. 407-412, see pp. 407-412, and Figures 1 (a)-1 (I), 6 pages.
Plobi, A. et al., "Wafer direct bonding: tailoring adhesion between brittle materials," Materials Science and Engineering Review Journal, 1999, R25, 88 pages.

* cited by examiner

CHIPLET-TO-CHIPLET PROTOCOL SWITCH

BACKGROUND

Field

The field relates to a bonded structure with a chiplet-to-chiplet protocol switch die.

Description of the Related Art

Semiconductor devices, in particular system on chip (SoC) devices, have increased in complexity while also decreased in size and dimension. As semiconductor devices become more complex, the importance of chiplet-to-chiplet communication of these devices has increased.

SUMMARY

For purposes of summarizing the disclosure and the advantages achieved over the prior art, certain objects and advantages of the disclosure are described herein. Not all such objects or advantages may be achieved in any particular embodiment. Thus, for example, those skilled in the art will recognize that the invention may be embodied or carried out in a manner that achieves or optimizes one advantage or group of advantages as taught herein without necessarily achieving other objects or advantages as may be taught or suggested herein.

All of these implementations are intended to be within the scope of the invention herein disclosed. These and other implementations will become readily apparent to those skilled in the art from the following detailed description of the preferred implementations having reference to the attached figures, the invention not being limited to any particular preferred implementations disclosed.

In one implementations, a bonded structure can include: a carrier; a first die comprising a first communications circuitry to format a communication signal according to a first communication protocol and to transmit the communication signal, the first die directly bonded to the carrier without an intervening adhesive; a protocol switch die directly bonded to the carrier without an intervening adhesive, the protocol switch die comprising circuitry to receive the communications signal and to convert the communication signal from the first communication protocol to a second communication protocol, wherein the second communication protocol is different from the first communication protocol, wherein the protocol switch die transmits the communication signal according to the second communication protocol; and a second die comprising a second communications circuitry to receive the communication signal formatted in the second communication protocol, the second die directly bonded to the carrier without an intervening adhesive.

In some implementations, the protocol switch die converts the second communication protocol to the first communication protocol. In some implementations, the first communication circuitry receives the communication signal from the protocol switch die. In some implementations, the second communication circuitry transmits the communication signal. In some implementations, the protocol switch die includes processing circuitry to convert the first communication protocol to the second communication protocol. In some implementations, the processing circuitry converts the first communication protocol to a plurality of communication protocols. In some implementations, the processing circuitry converts the plurality of communication protocols to the first communication protocol. In some implementations, the processing circuitry converts the plurality of communication protocols to a second plurality of communication protocols. In some implementations, at least 90% of the circuitry is configured to convert between the communication protocols. In some implementations, the protocol switch die includes additional active circuitry configured for other processing functionalities.

In some implementations, the protocol switch die includes a memory to store various communication protocols. In some implementations, a format of the first communication protocol and a format of the second communication protocol is based on at least one of architecture, data rate, number of input/output interconnects, voltages, clock speed, power, latency, bit error rate, or channel loss. In some implementations, the architecture includes a serial architecture or a parallel architecture. In some implementations, the protocol switch die detects the format of the first communication signal and the format of the second communication signal. In some implementations, the protocol switch die detects the format of the first communication protocol and the format of the second communication protocol during an initial powering on state.

In some implementations, the carrier includes a semiconductor element or an interposer die. In some implementations, a first nonconductive bonding layer of the carrier is directly bonded to a second nonconductive layer of the first die without an intervening adhesive, and wherein a first contact feature of the carrier is directly bonded to a second contact feature of the first die without an intervening adhesive.

In some implementations, the first nonconductive bonding layer of the carrier is directly bonded to a third nonconductive layer of the second die without an intervening adhesive; and wherein the first contact feature of the carrier is directly bonded to a third contact feature of the second die without the intervening adhesive. In some implementations, the first nonconductive bonding layer of the carrier is directly bonded to a fourth nonconductive layer of the protocol switch die without an intervening adhesive; and wherein the first contact feature of the carrier is directly bonded to a fourth contact feature of the protocol switch die without an intervening adhesive.

In some implementations, the bonded structure includes one or more traces that electrically connect the first die and the second die to the protocol switch die. In some implementations, an encapsulating material is provided over a portion of the carrier, the first die, the second die, and the protocol switch die. In some implementations, the protocol switch die includes a multiplexer to receive at least one protocol of a plurality of incoming communication protocols and to convert the at least one protocol of the plurality of incoming communication to at least one protocol of a plurality of outgoing communication protocols based at least on a control input. In some implementations, the control input is based at least on a user input, an automatic determination, a present application, or a system application.

In another implementations, a bonded structure can include: a carrier comprising protocol switch circuitry to convert between a first communication protocol to a second communication protocol; a first die directly bonded to the carrier without an intervening adhesive, the first die comprising a first communication circuitry to format a communication signal according to the first communication protocol and to transmit the communication signal to the protocol switch circuitry; and a second die directly bonded to the carrier without an intervening adhesive, the second die comprising a second communication circuitry to receive the communication signal formatted according to the second communication protocol from the protocol switch circuitry, wherein the second communication protocol is different from the first communication protocol.

In some implementations, the protocol switch circuitry includes a processing circuitry to convert the first communication protocol to the second communication protocol. In some implementations, the protocol switch circuitry converts the first communication protocol to a plurality of communication protocols. In some implementations, the protocol switch circuitry converts the plurality of communication protocols to the first communication protocol. In some implementations, the protocol switch circuitry converts the plurality of communication protocols to a second plurality of communication protocols. In some implementations, the first communication circuitry receives the communication signal from the protocol switch circuitry. In some implementations, the second die transmits the communication signal. In some implementations, the protocol switch circuitry detects a format of the first communication protocol and a format of the another communication protocol. In some implementations, the protocol switch circuitry detects the format of the first communication protocol and the format of the second communication protocol during an initial powering on state.

In some implementations, a first nonconductive bonding layer of the carrier is directly bonded to a second nonconductive layer of the first die without an intervening adhesive and a first contact feature of the carrier is directly bonded to a second contact feature of the first die without an intervening adhesive. In some implementations, a first nonconductive bonding layer of the carrier is directly bonded to a third nonconductive layer of the second die without an intervening adhesive and a first contact feature of the carrier is directly bonded to a third contact feature of the second die without the intervening adhesive. In some implementations, the bonded structure includes one or more traces that electrically connect the first die and the second die to the protocol switch circuitry. In some implementations, an encapsulating material is provided over the carrier, the first die, and the second die. In some implementations, the protocol switch circuitry is embedded within the carrier. In some implementations, the protocol switch circuitry is patterned on the carrier.

In some implementations, the protocol switch die includes a multiplexer to receive at least one protocol of a plurality of incoming communication protocols and to convert the at least one protocol of the plurality of incoming communication protocols to at least one protocol of a plurality of outgoing communication protocols based at least on a control input. In some implementations, the control input is based at least on a user input, an automatic determination, a present application, or a system application.

In another implementations, a method of converting a first communication protocol to a second communication protocol can include: providing a first die comprising a first communications circuitry to format a communication signal according to the first communication protocol; providing a second die comprising a second communications circuitry to format the communication signal according to the second communication protocol; providing a protocol switch die to convert the first communication protocol to the second communication protocol; transmitting the communication signal formatted according to the first communication protocol from the first die to the protocol switch die; converting the communication signal from the first communication protocol to the second communication protocol at the protocol switch die; and transmitting the communication signal according to the second communication protocol from the protocol switch die to the second die, wherein the first die, the second die, and the protocol switch die are directly bonded to a surface of a carrier without an intervening adhesive such that the first die, the second die, and the protocol switch die are electrically connected.

In some implementations, the method includes converting the second communication protocol to the first communication protocol by the protocol switch die. In some implementations, the carrier includes an interposer die. In some implementations, the method includes detecting a format of the first communication protocol and a format of the second communication protocol by the protocol switch die. In some implementations, the method includes detecting the format of the first communication protocol and the format of the second communication protocol by the protocol switch die during an initial powering on state. In some implementations, the method includes electrically connecting the first die and the second die to the protocol switch die by one or more traces.

In another implementations, an integrated device die can include: an input terminal to receive a signal formatted in a first communication protocol; protocol switching circuitry to convert the signal from the first communication protocol to a second communication protocol; and an output terminal to transmit the signal formatted in the second communication protocol.

In some implementations, the integrated device die is directly bonded to an element without an intervening adhesive. In some implementations, the protocol switching circuitry processes switching between communication protocols and other processing functionalities different from switching between communications protocols. In some implementations, the integrated device die additional active circuitry for processing functionalities different from switching between communications protocols. In some implementations, the protocol switching circuitry converts the signal from the second communication protocol to the first communication protocol. In some implementations, the integrated device die includes processing circuitry to convert the first communication protocol to the second communication protocol. In some implementations, the processing circuitry converts the first communication protocol to a plurality of communication protocols. In some implementations, the processing circuitry convert the plurality of communication protocols to the first communication protocol. In some implementations, the processing circuitry converts the plurality of communication protocols to a second plurality of protocols.

In some implementations, the integrated device die includes a memory to store various communication protocols. In some implementations, a format of the first communication protocol and a format of the second communication protocol is based on at least one of architecture, data rate, number of input/output interconnects, voltages, clock speed, power, latency, bit error rate, or channel loss. In some implementations, the architecture includes a serial architecture or a parallel architecture. In some implementations, the integrated device die detects the format of the first communication signal and the format of the second communication signal. In some implementations, the integrated device die detects a format of the first communication protocol and the format of the second communication protocol during an initial powering on state. In some implementations, the integrated device die includes a multiplexer to receive at least one protocol of a plurality of incoming communication protocols and to convert the at least one protocol of the plurality of incoming communication protocols to at least one protocol of a plurality of outgoing communication protocols based at least on a control input. In some implementations, the control input is based at least on a user input, an automatic determination, a present application, or a system application.

In another implementation, a bonded structure can include: a carrier; a first die comprising a first communications circuitry to format a communication signal according to a first communication protocol and to transmit the communication signal; an integrated device die disposed in or on the carrier, the integrated device die comprising protocol switch circuitry to receive the communication signal and to convert the communication signal from the first communication protocol to a second communication protocol, wherein the second communication protocol is different from the first communication protocol, wherein the integrated device die transmits the communication signal according to the second communication protocol; and a second die comprising a second communications circuitry to receive the communication signal formatted in the second communication protocol.

In some implementations, the integrated device die converts the second communication protocol to the first communication protocol. In some implementations, the first communication circuitry receives the communication signal from the integrated device die. In some implementations, the second communication circuitry transmits the communication signal. In some implementations, the integrated device die includes processing circuitry to convert the first communication protocol to the second communication protocol. In some implementations, the processing circuitry converts the first communication protocol to a plurality of communication protocols. In some implementations, the processing circuitry converts the plurality of communication protocols to the first communication protocol. In some implementations, the processing circuitry converts the plurality of communication protocols to a second plurality of communication protocols.

In some implementations, the integrated device die includes a memory to store various communication protocols. In some implementations, a format of the first communication protocol and a format of the second communication protocol is based on at least one of architecture, data rate, number of input/output interconnects, voltages, clock speed, power, latency, bit error rate, or channel loss. In some implementations, the architecture includes a serial architecture or a parallel architecture. In some implementations, the integrated device die detects the format of the first communication signal and the format of the second communication signal. In some implementations, the integrated device die detects the format of the first communication protocol and the format of the second communication protocol during an initial powering on state, the carrier includes a semiconductor element or an interposer die.

In some implementations, the first die, second die, and integrated device die are direct bonded to the carrier. In some implementations, a first nonconductive bonding layer of the carrier is directly bonded to a second nonconductive layer of the first die without an intervening adhesive, and wherein a first contact feature of the carrier is directly bonded to a second contact feature of the first die without an intervening adhesive. In some implementations, the first nonconductive bonding layer of the carrier is directly bonded to a third nonconductive layer of the second die without an intervening adhesive, and wherein the first contact feature of the carrier is directly bonded to a third contact feature of the second die without an intervening adhesive. In some implementations, the first nonconductive bonding layer of the carrier is directly bonded to a fourth nonconductive layer of the integrated device die without an intervening adhesive, and wherein the first contact feature of the carrier is directly bonded to a fourth contact feature of the integrated device die without an intervening adhesive.

In some implementations, the first die, second die, and integrated device die are flip chip bonded to the carrier. In some implementations, the bonded structure includes one or more traces that electrically connect the first die and the second die to the integrated device die. In some implementations, an encapsulating material is provided over a portion of the carrier, the first die, the second die, and the integrated device die. In some implementations, the integrated device die includes a multiplexer to receive at least one protocol of a plurality of incoming communication protocols and to convert the at least one protocol of the plurality of incoming communication protocols to at least one protocol of a plurality of outgoing communication protocols based at least on a control input. In some implementations, the control input is based at least on a user input, an automatic determination, a present application, or a system application.

In another implementation, a method of manufacturing a bonded structure can include: providing a first die comprising a first communications circuitry to format a communication signal according to the first communication protocol; providing a second die comprising a second communications circuitry to format the communication signal according to the second communication protocol; providing a protocol switch die to convert the first communication protocol to the second communication protocol; directly bonding the first die, the second die, and the protocol switch to a surface of a carrier without an intervening adhesive such that the first die, the second die, and the protocol switch die are electrically connected; wherein the bonded structure transmits the communication signal formatted according to the first communication protocol from the first die to the protocol switch die; wherein the bonded structure converts the communication signal from the first communication protocol to the second communication protocol at the protocol switch die; and wherein the bonded structure transmits the communication signal according to the second communication protocol from the protocol switch die to the second die. In some implementations, in the carrier comprises an interposer die.

BRIEF DESCRIPTION OF THE DRAWINGS

Various implementations will be described hereinafter with reference to the accompanying drawings. These implementations are illustrated and described by example only and are not intended to limit the scope of the disclosure. In the drawings, similar elements have similar reference numerals.

DETAILED DESCRIPTION

Figure 1A:
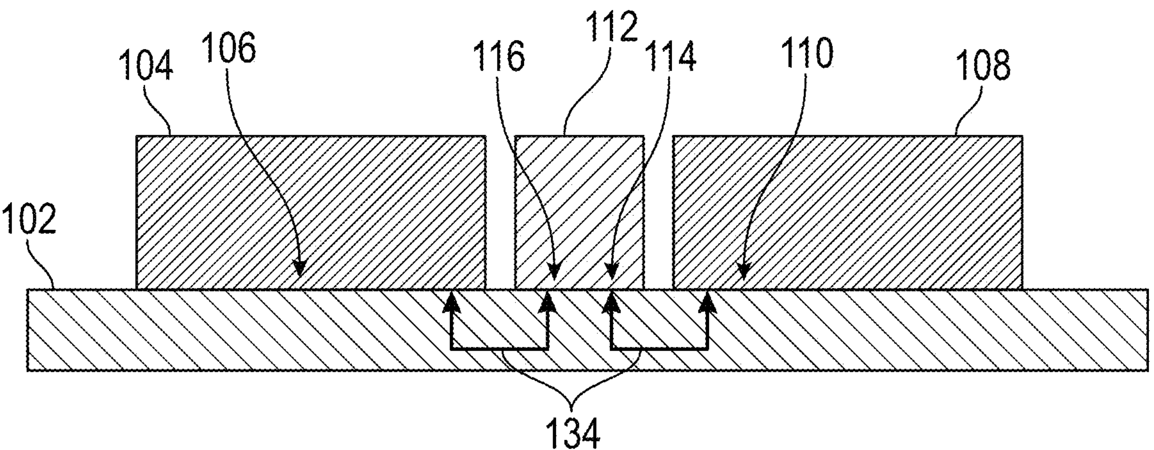
FIG. 1A is a schematic cross sectional side view of a bonded structure, according to various embodiments.

The present disclosure may be understood by reference to the following detailed description. It is noted that, for purposes of illustrative clarity, certain elements in various drawings may not be drawn to scale, may be represented schematically or conceptually, or otherwise may not correspond exactly to certain physical configurations of embodiments.

Implementations relate to protocol switching elements for the conversion of protocol and/or communication signals between chiplets bonded (e.g., hybrid bonded, flip chip bonded, etc.) to a carrier (e.g. another chip, active or passive interposer, routing substrate, etc.). A bonded structure with a chiplet-to-chiplet protocol switch die and/or circuitry can be configured to convert one or more communication signals transmitted and/or received by to one or more adjacent chiplets that are in communication with one another. The protocol switch die can be programmed to convert signals conforming to a first protocol of a first chiplet to a second protocol of a second chiplet. Chiplet protocol conversion can refer to converting and/or translating data communication protocols between chiplets in a multi-chiplet system in which at least two chips operate or communicate according to different protocols. Chiplet protocol conversions can convert between different communication protocols of a chiplet manufacturer when chiplets use different communication protocols that are incompatible with each other. In a multi-chiplet system, different chiplets can have their own communication protocols based on their functionalities, design considerations, and/or legacy requirements. However, for effective communication and/or interoperability between chiplets, conversion between the communication protocol used by one chiplet into a format that can be understood by another chiplet in order for the chiplets to communicate with one another can take place in a separate die. Accordingly, there remains a continuing demand for improved communication translation and conversion devices and processes.

As applications and systems utilize more and more processing power, high performance chips (e.g., as CPUs (Central Processing Units), FPGAs (Field-Programmable Gate Arrays), APUs (Application Processor Units), ASICs (Application-Specific Integrated Circuits), ASSPs (Application-Specific Standard Parts), MCU (Microcontrollers), and/or GPUs (Graphics Processing Units)) including multi-core processors, and/or network switches) are becoming larger and larger. But the combination of reticle size challenges, optimized use of real estate using advanced node process, and/or yield of such large chips is driving the industry towards disaggregation and the adoption of chiplets. With advanced node semiconductor fabrication and evolving chip and system architectures, chip designers are adopting chip disaggregation by moving to multi-die architecture and the use advanced packaging to formulate advanced SoC designs. High-speed, high-performance chips need to communicate with each other, for example using high speed, high bandwidth communication. A die to interface, which is a functional block to provide interfacing data between dies within the same package can made of a physical layer (PHY) and/or controller blocks. The PHY can establish and maintain the physical transmission of data between network devices. The PHY can be implemented using high speed Serializer/Deserializer (SERDES) architecture or high-density parallel architecture. SERDES can convert parallel data into a serial data stream for transmission over a communication link and then converts it back to parallel data at the receiving end. The Serializer component of SERDES can take parallel data inputs and converts them into a serial bit stream by using techniques like encoding, modulation, and clock recovery. The Serializer can include features such as data serialization, parallel-to-serial conversion, and/or encoding schemes for error detection and correction. The Deserializer component, on the other hand, can receive the serial data stream and convert it back into parallel data. The Deserializer can perform tasks such as clock and data recovery, demodulation, and/or parallel-to-serial conversion. SERDES, as a functional block, can be part of a chiplet (e.g., a conversion process such as Parallel-In, Serial-Out (PISO), Serial-In, Parallel-Out (SIPO), etc.), but SERDES is designed to support a particular standard. In this instance, while SERDES is not extracted out of the chiplet and inputted into a conversion die, SERDES can be implement in several functional blocks on conversion dies to be able to communicate to SERDES on the chip. In some implementations, SERDES can be removed from the chiplet and placed on the conversion die, but some functionality may still remain on the chiplet to enable such off chiplet SERDES/parallel architecture. High speed chip-to-chip communication facilitated by SERDES, which can be one or more functional block on the chip that serializes and deserializes digital data. Complex SoCs implement SERDES to support multiple data rates and bandwidth with varied standards like UCIe, PCIe, MIPI, Ethernet, USB, SATA, etc. Although this communication interfacing could be broadly divided into such serial and parallel interfacing, the designers need to consider other parameters including overall bandwidth, beach front bandwidth (at the chip edges), latency, energy efficiency and power consumption, interconnect density, debug and repair strategy, etc. While these communication protocols are sometimes standardized, designing with same communication protocol standard for all the chips with varied the functionalities, process nodes, applications, and/or supply chains, can be challenging (e.g. one manufacturing partner may have its own proprietary communication protocol that they may not want to design away from it). High-density parallel architecture can refer to maximizing the number of computing elements and/or processing units within a given physical space and/or form factor. Parallel architecture can achieve high computational power and/or performance by leveraging a large number of parallel processing units. In high-density parallel architecture, multiple processing units, such as CPUs, FPGAS, APUs, ASICs, ASSPs, MCUs, and/or GPUs, can be densely packed together to form a parallel computing system. These processing units can work together simultaneously, independently, and/or in a coordinated manner to perform complex computations and process large amounts of data in parallel.

To facilitate such complicated inter-chiplet interfacing, chiplet protocol conversion can include one or more components that act as protocol converters and/or adapters. These components receive data in one protocol format, perform the conversions and/or translations, and output the data in the desired protocol format. The conversion can include modifying data structures, adapting communication speeds, bandwidth adjustments and latency, interconnect density at the beach front, adjusting voltage levels, and/or translating control signals, clock or clock forwarding, number of channels, error detection and debug protocols, repair strategy, physical layer linking and die to die adaptor along with modifications based on packaging of choice (e.g. organic or Si interposer, reconstituted die/wafer, organic or Silicon bridge, high density routing (e.g. RDL)), etc. Chiplet protocol conversion can occur using hardware-based solutions, such as specialized protocol conversion chips and/or integrated circuits (ICs), or through software-based solutions implemented in microcontrollers and/or programmable devices as well as combination of such hardware and software solutions. The conversion choice can depend on the complexity of the protocol conversion, the performance requirements, and/or the available resources in the system. Chiplet protocol conversion can enable communication and/or data exchange between chiplets that would otherwise be incompatible due to different communication protocols. Further, chiplet protocol conversion can play a role in multi-chiplet systems, allowing diverse chiplets to work together effectively and/or facilitate the overall functionality and performance of the system.

FIG. 1A is a schematic side sectional view of a bonded structure 100 including a carrier 102, a first die 104 having a first communication circuitry 106 to format a communication signal for transmission according to a first communication protocol, a second die 108 having a second communication circuitry 110 to receive the communication signal formatted in a second communication protocol, and a protocol switch die 112 having processing circuitry 114 to receive the communication signal from the first die 104 and convert the communication signal from the first communication protocol to the second communication protocol before transmitting the communication signal to the second die 108. In some implementations, the first die 104, second die 108, and/or the protocol switch die 112 can be integrated device dies. Additionally or alternatively, the protocol switch die 112 can receive the communication signal from the second die 108 and convert the communication signal from the second communication protocol to the first communication protocol before transmitting the communication signal to the first die 104, so as to enable a two-way interaction between first die 104 and second die 108. In some implementations, the protocol switch die 112 can be an integrated device die having protocol switch circuitry. For example, the integrated device die can include protocol switch circuitry 212 described below.

The first communication circuitry 106, second communication circuitry 110, and/or processing circuitry 114 can be located near and/or adjacent a surface of their respective die closest to the carrier 102. In other implementations, the first communication circuitry 106, second communication circuitry 110, and/or processing circuitry 114 can be located at the front or back of their respective dies (e.g., near and/or adjacent to an upper or lower surface relative to the carrier 102). The first die 104, second die 108, and/or protocol switch die 112 can be in a front-to-front bonding configuration with the carrier 102 (e.g., aligned and bonded together at their front surfaces where the active electronic devices and/or circuitry are located) and/or in a back-to-back bonding configuration with the carrier 102 (e.g., aligned and bonded together at their back surfaces) and/or in a front-to-back bonding configuration with the carrier 102. If the backside of any of the dies 104, 108, 112 are attached to the carrier 102, through-substrate vias (TSVs) can electrically connect the circuitry on the front top of the carrier 102 to contacts disposed on the bottom and/or back of the dies 104, 108, 112. The first communication protocol and the second communication protocol can include one or more different characteristics that are incompatible with one another as explained herein. The protocol switch die 112 can switch between any number of formats and can detect which of a plurality of conversions to make as further described below.

The first die 104 and/or second die 108 can by any suitable type of die and/or chiplet. For example, the first die 104 and/or second die 108 can be processor chiplets (e.g. compute, accelerator, etc.), memory chiplets, graphic chiplets, controller chiplets, IO chiplets, analog, RF and/or optical chiplets, specialized chiplets, etc. The first die 104 and/or second die 108 can be fabricated by any fabrication process node. For example, first die 104 may be fabricated using first fabrication process node (e.g. 5 nm) and second die 108 may be fabricated using second process node (e.g. 22 nm). The first die 104 and/or second die 108 can perform the same or different types of functions with active circuitry configured for those functions. The specific types and/or functionalities of the first die 104 and/or second die 108 can vary depending on the intended application and/or system requirements. The first communication circuitry 106 of first die 104 and the second communication circuitry 110 of second die 108 can comprise a portion of the active circuitry (or can be separate from the active circuitry) that performs the primary function of the first die 104 and second die 108. The first communication circuitry 106 and second communication circuitry 110 can transmit outputs from and/or receive inputs to their respective dies which are used by the active circuitry to perform their respective functionalities.

Figure 2:
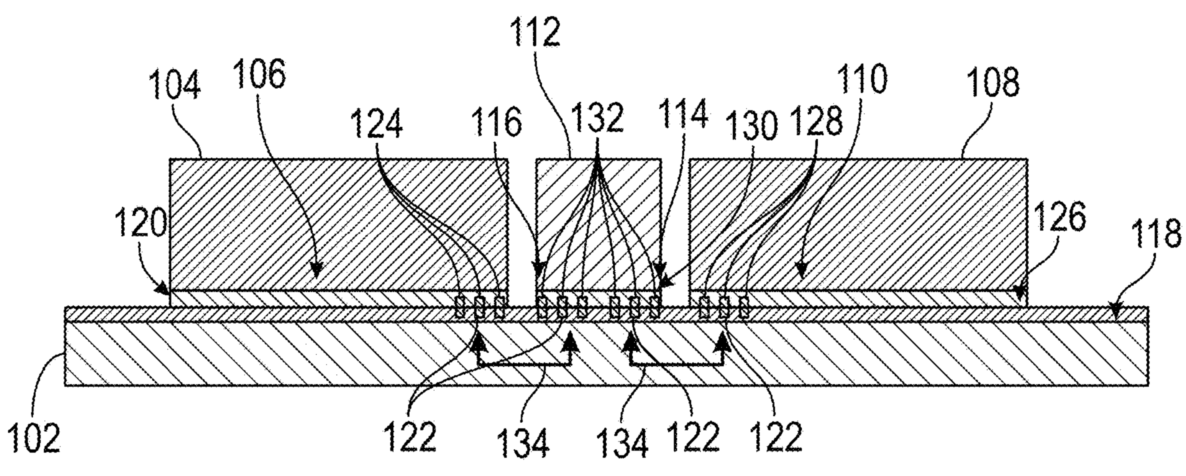
FIG. 2 illustrates the bonded structure of FIG. 1A or 1B.

In some implementations, as shown in FIG. 2, the first die 104, second die 108, and protocol switch die 112 can be bonded adjacent to one another on the carrier 102. The first die 104, second die 108, and/or protocol switch die 112 can be directly bonded to (e.g., hybrid bonded to) the carrier 102 without an intervening adhesive. In some implementations, the carrier 102 can include a semiconductor element (e.g., an active device die or chip with active circuitry, an interposer die and/or a reconstituted wafer/die. In another implementation, the first die 104, second die 108, and/or protocol switch die 112 can be bonded using other methods (e.g. flip chip bonding).

Communication protocols can be the language and/or formats by which two or more chiplets communicate to one another within a system or package. The communication protocol is a set of rules and/or conventions that can define how information is exchanged and transmitted between two or more chiplets. The choice of communication protocol for chiplets can depend on one or more factors such as system requirements, performance needs, power constraints, and/or compatibility with existing infrastructure. Different chiplets within a system can use different protocols depending on their specific functionalities and/or communication requirements. In some implementation, the protocol switch die 112 can convert the second communication protocol to the first communication protocol. The second communication circuitry 110 can transmits the communication signal from the second die 108 to the protocol switch die 112. The first communication circuitry 106 can receive the communication signal from the protocol switch die 112.

Figure 1B:
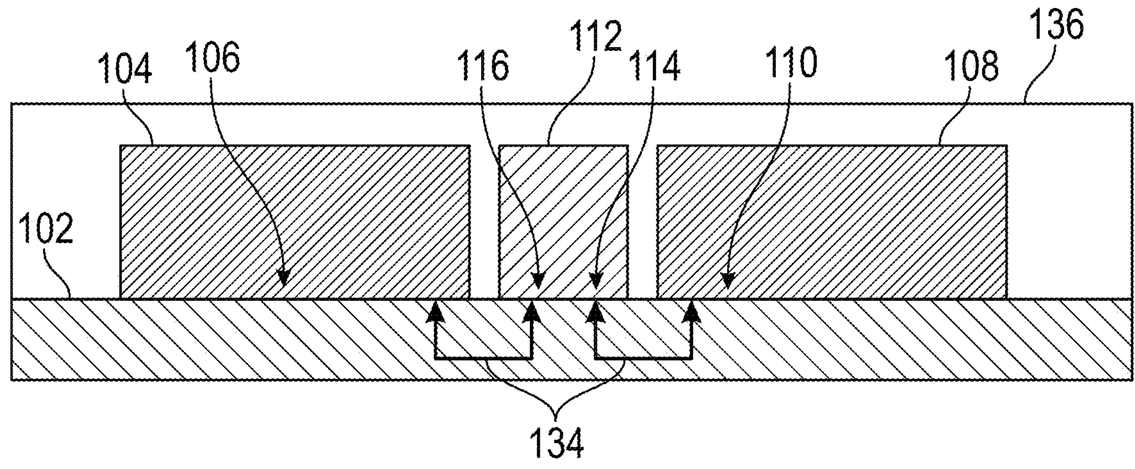
FIG. 1B is a schematic cross sectional side view of the bonded structure of FIG. 1A that includes an encapsulating material.

In some implementations, the bonded structure 100 can also include one or more traces along a communication path 134 that electrically connect the first die 104 and the second die 108 to the protocol switch die 112. The traces can be embedded in one or more interconnect layers formed in or on carrier 102. In some implementations, as illustrated in FIG. 1B, an encapsulating material 136 can be provided over a portion of the carrier 102, the first die 104, the second die 108, and the protocol switch die 112. The encapsulating material 136 can include one or multiple layers. In some implementations, the encapsulating material 136 can be an inorganic dielectric (e.g., silicon oxide, silicon nitride). In other implementations, the encapsulating material 136 can be an organic dielectric, such as a epoxy molding compound (EMC) or combination of organic or inorganic materials. The encapsulating material 136 can serves to protect the first die 104, second die 108, and/or protocol switch die 112.

The communication circuitry of the dies and/or chiplets mentioned herein can format the communication signals to be transmitted and/or received by other dies and/or chiplets. A format of the first communication protocol (in some implementations the source signal) and/or the second communication protocol (in some implementations the destination signal) can be based on at least one of architecture, power, latency, data rate, number of input/output interconnects, voltages, clock speed, bit error rate, and/or channel loss. In some implementations, the format of the architecture can include parallel architecture and/or serial architecture. In some implementations, the architecture can include SERDES architecture or high-density parallel architecture as described above. In a parallel architecture, multiple dies are connected to one another using multiple communication channels. Data is then transferred in parallel through the multiple communication channels. By using multiple channels in parallel, there is a high bandwidth, low data rate exchange per lane, low latency, and lower power requirements as well as high cross coupling noise, high capacitive load, and high leakage power. An interposer (or a reconstituted die/wafer component) can provide the pin connections for high-density routing. In contrast, for a series architecture, dies can be connected sequentially resulting in fewer interconnect structures being used. The serial interconnect interfaces include a limited bit rate, high latency, and higher power, which can be accomplished over low-density routing. Choosing between a parallel or a series configuration can depend on data transfer rates, power constraints, package size, etc. In a parallel configuration, each die and/or chiplet can have its own communication protocol implementation and communication channels with additional communication conversion components between each die. In a series configuration, communication conversion components can convert the communication signal as each stage of the of the signal transmission, which can reduce power consumption.

Different communication protocols can additionally or alternatively use various voltage levels to represent logic states, which can be converted between the various communication protocols. The communication conversion components (e.g., protocol switch die 112) can receive the voltage of the transmitted signal and match the voltage requirement of the receiving chiplet. If the voltage levels differ, voltage level shifting or voltage level conversion techniques can be employed to match the requirements of the receiving chiplet. The protocol conversion process can involve translating the voltage levels of the signals from the source protocol to the voltage levels expected by the destination protocol. This translation can ensure that the converted signals adhere to the voltage specifications of the receiving chiplet and can be reliably interpreted.

A communication protocol conversion can additionally or alternatively vary clocking mechanisms and/or speeds. Clock frequency of protocols determines the rate of which data is transmitted and received. Communication protocols can have synchronous (e.g., uses a clock signal to synchronize data transmission, with data being sent in predefined frames or packets) or asynchronous (e.g., do not use a clock signal and instead rely on start and stop bits or other synchronization methods) timing. A difference in clocking mechanisms and/or speeds can be aligned during a conversion. Frequency format, such as bit rate, can additionally or alternatively be considered for any conversions to take place as the frequency of the clock signal can impact the bit rate of the protocol. Higher clock frequencies can allow for faster data transfer rates, while lower frequencies result in slower data rates. When converting between protocols, the difference in clock frequencies may affect the achievable bit rate of the converted protocol. The data transfer rate and timing characteristics, including data setup/hold times, clock frequency, and data valid windows, should be converted to maintain data integrity and meet timing constraints.

Communication protocol conversions can additionally or alternatively consider error detection and handling considerations. These mechanisms for error detection, such as checksums or CRC (Cyclic Redundancy Check), which is an error-detecting code commonly used in digital networks and storage devices to detect accidental changes to digital data, can be preserved during the protocol conversion. Similarly, bit error rate (BER), which is a measure of the number of erroneous bits in a data transmission system relative to the total number of transmitted bits can be considered in protocol translations. When converting protocols between chiplets, the BER can provide an indication of the quality and reliability of the converted signal. The source and destination protocols can have specific BER requirements and/or specifications that need to be met for reliable data transmission. These specifications define the acceptable level of error rate for the system to operate effectively. The protocol conversion process should aim to maintain or improve the BER performance within the specified limits.

Channel loss can refer to the attenuation and/or degradation of a signal as it travels through a communication channel. During conversion, the converted signal can additionally or alternatively take into account the effects of the channel loss to maintain reliable communication between the chiplets. Channel loss can result in a reduction of signal amplitude and quality. As the signal passes through the channel, it may experience attenuation, distortion, and/or noise. These effects can impact the accuracy and reliability of the data being transmitted. When converting protocols, the conversion process can consider the signal integrity requirements of both the source and destination protocols such that the converted signal maintains an acceptable level of integrity. In some cases, the protocol conversion process can adapt the converted signal to better suit the characteristics of the communication channel. This adaptation can include modifying the signal encoding, adjusting voltage levels, and/or implementing other signal processing techniques to enhance compatibility and minimize the impact of channel loss.

Accordingly, various implementations disclosed herein can utilize a protocol switch die and/or circuitry to convert between two or more communication protocols with varying data and/or signal formats as explained above. The protocol switch die and/or circuitry can detect which of a plurality of conversions to make. By translating communication protocols between or more dies, chiplet from different manufacturers and/or differing communication protocols can be integrated into one system. For example, the protocol switch die 112 can detect the format of the first communication signal and/or a format of the second communication signal at any suitable time. For example, the protocol switch die 112 can detect a format of the format of the first communication protocol and/or the format of the second communication protocol during an initial powering on state. In other implementations, the protocol switch die 112 can detect the format of the first and/or second communication protocol upon receiving the first and/or second communication protocol. In some implementations, a user, such as a manufacturer and/or operator, can pre-select the format of the first and/or second communication protocol. The protocol switch die 112 can also be pre-set to the formats of the first and/or second communication protocol.

The protocol switch die 112 can also include processing circuitry 114 to convert the first communication protocol to the second communication protocol. In some implementations, the processing circuitry 114 can convert the first communication protocol to a plurality of communication protocols. Additionally or alternatively, the processing circuitry 114 can convert the plurality of communication protocols to the first communication protocol. In some implementations, the processing circuitry 114 can convert the plurality of communication protocols to a second plurality of communication protocols. In some implementations, the protocol switch die 112 can include circuitry (e.g., processing circuitry 114) to convert between the communication protocols. Additionally or alternatively, at least 90% of the circuitry can be allocated to convert between the communication protocols. In some implementations, the protocol switch die 112 can include additional active circuitry for other processing functionalities alongside the circuitry for converting the communication protocols. The protocol switch die 112 can include a memory 116 to store various communication protocols such as the first communication protocol, the second communication protocol, the first plurality of communication protocols, and/or the second plurality of communication protocols. In some implementations, by including various communication protocols within the memory 116, the protocol switch die 112 can be enabled to select the appropriate communication protocol conversion to make. In some implementations, the protocol switch die 112 can comprise circuitry including a multiplexer that can receive any one of several incoming communication protocols (e.g., the first communication and/or the plurality of communication protocols) and convert the any one of several incoming communication protocols to any one of several outgoing communication protocols (e.g., the second communication protocol and/or the plurality of communication protocols) based at least on a control input such as a user input, an automatic determination, a present application, and/or a system application. Additionally or alternatively, the multiplexer can receive any one of several incoming communication protocols and convert the any one of several incoming communication protocols to a singular outgoing communication protocols based at least on a user input and/or a system application. The multiplexer can select between one or more incoming signals and route the one or more incoming signals to a single output. As mentioned above, the multiplexer can allow for data and/or signals from different sources to be combined and/or selected based on the control inputs. The control inputs can be based on a user input, an automatic determination, a present application, and/or a system application.

FIG. 2 illustrates the bonded structure of FIG. 1A or FIG. 1B showing the first die 104, second die 108, and protocol switch die 112 directly bonded to the carrier 102. In some implementations, direct bonding can be direct hybrid bonding as described below. In some implementations, one or more of first die 104, second die 108, and/or protocol switch die 112 can be flip chip bonded to the carrier 102. As illustrated in FIG. 2, in some implementation, the carrier 102 can include a first nonconductive (e.g., an inorganic dielectric) bonding layer 118. In some embodiments, the first nonconductive bonding layer 118 can include silicon oxide, silicon nitride, silicon oxynitride, silicon oxycarbonitride, or silicon carbonitride. The first nonconductive bonding layer 118 of the carrier 102 can be directly bonded to a second nonconductive layer 120 of the first die 104 without an intervening adhesive. A first contact feature 122 (e.g., contact pads, exposed ends of vias (e.g., TSVs), or a through substrate electrodes) of the carrier 102 can be directly bonded to a second contact feature 124 of the first die 104 without an intervening adhesive. In some implementations, the first nonconductive bonding layer 118 of the carrier 102 can be directly bonded to a third nonconductive layer 126 of the second die 108 without an intervening adhesive. The first contact feature 122 of the carrier 102 can be directly bonded to a third contact feature 128 of the second die 108 without an intervening adhesive. Further, in some implementations, the first nonconductive bonding layer 118 of the carrier 102 can be directly bonded to a fourth nonconductive layer 130 of the protocol switch die 112 without an intervening adhesive. The first contact feature 122 of the carrier 102 can be directly bonded to a fourth contact feature 132 of the protocol switch die 112 without an intervening adhesive. The first contact feature 122, second contact feature 124, third contact feature 128, fourth contact feature 132 can provide electrical communication to the other elements. Additionally, or alternatively, the first contact feature 122, second contact feature 124, third contact feature 128, fourth contact feature 132 can include discrete conductive pads. In some implementations, the protocol switch die 112 can be in electrical communication with two or more dies and/or chiplets. The protocol switch die 112 can perform more than one communication protocol conversion between the varies dies and/or chiplets. Although the contact features 122, 124, 128, and 132 can provide electrical communication link between these elements are shown, other contacts that help directly communicate the first die 104, second die 108, and/or protocol switch die 112 with the carrier 102 without communicating to other die may also be available.

Figure 3A:
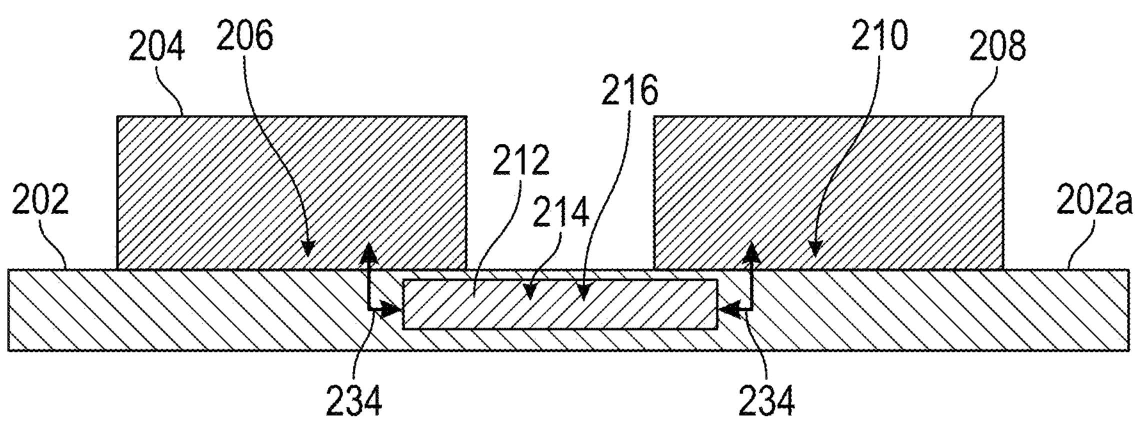
FIG. 3A illustrates another implementation of a bonded structure that includes a protocol switch circuitry embedded on the carrier.
Figure 3B:
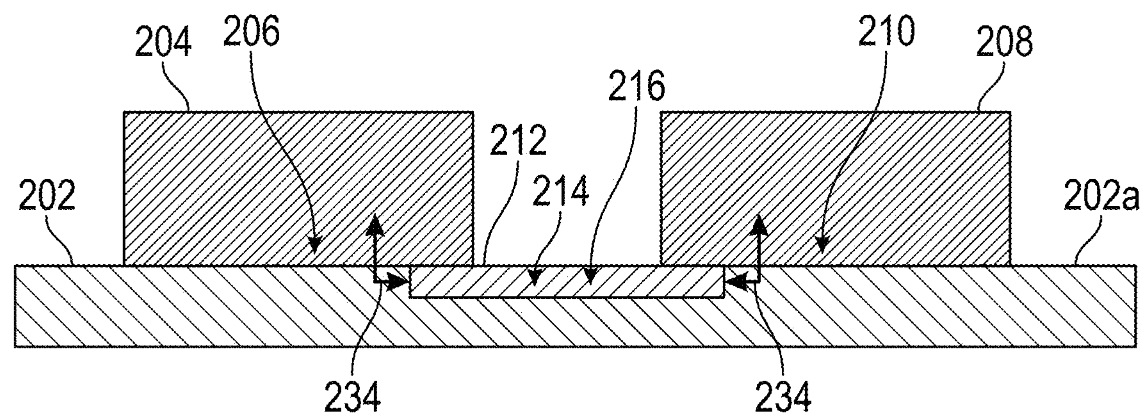
FIG. 3B illustrates another implementation of a bonded structure that includes a protocol switch circuitry patterned thereon.

FIGS. 3A and 3B illustrate another implementation of a bonded structure 200. FIGS. 3A and 3B are generally similar to the implementations of FIGS. 1A-2. Unless noted otherwise, the components in FIGS. 3A and 3B may be the same as or generally similar to the like-numbered components of FIGS. 1A-2. As illustrated in FIGS. 3A and 3B, the bonded structure 200 can include a carrier 202 having protocol switch circuitry 212 to convert a first communication protocol to second communication protocol (i.e., the first communication protocol is different than the second communication protocol), a first die 204 having a first communication circuitry 206 to format a communication signal according to a first communication protocol and to transmit the communication signal to the protocol switch circuitry 212, and second die 208 having a second communication circuitry 210 to receive the communication signal formatted according to the second communication protocol from the protocol switch circuitry 212.

Figure 4:
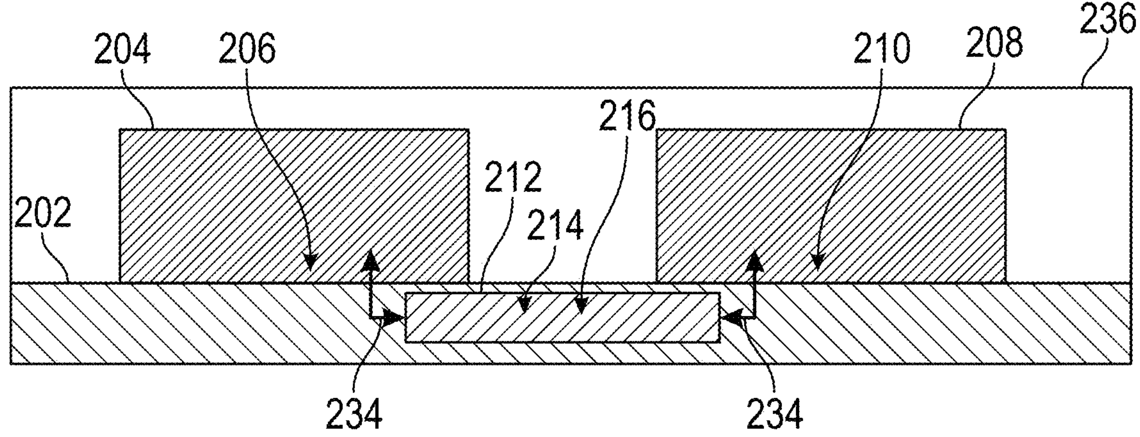
FIG. 4 is a schematic cross-sectional side view of the bonded structure of FIG. 3A that includes an encapsulating material.

The protocol switch circuitry 212 can be embedded within an insulating layer of the carrier 202 (e.g., a substrate such as a printed circuit board (PCB), interposer and/or reconstituted component) as shown in FIG. 3A. For example, in FIG. 3A, the protocol switch circuitry 212 can comprise a chip or discrete device (e.g., bridge die) that is embedded in insulating layers of the carrier 202 (which can be a package substrate or other substrate). As shown in the embodiment of FIG. 3B, the carrier 202 can be a semiconductor element (e.g., a die) in which the protocol switch circuitry 212 can be patterned or formed in the carrier 202. The first communication circuitry 206, second communication circuitry 210, and/or processing circuitry 214 can be located near and/or adjacent a surface of their respective die closest to a first surface 202*a* of the carrier 202. In other implementations, the first communication circuitry 206, second communication circuitry 210, and/or processing circuitry 214 can be located anywhere within their respective dies (e.g., near and/or adjacent to an upper or lower surface relative to the first surface 202*a* of the carrier 202). In some implementations, as illustrated in FIG. 4, an encapsulating material 236 can be provided over a portion of the carrier 202, the first die 204, and/or the second die 208. The encapsulating material 236 can include one or multiple layers. In some implementations, the encapsulating material 236 can be an inorganic dielectric (e.g., silicon oxide, silicon nitride). In other implementations, the encapsulating material 236 can be an organic dielectric, such as a polymer (e.g., epoxy, epoxy molding compound, etc.). The encapsulating material 236 can serves to protect the first die 204, and/or the second die 208.

In some implementations, the first 204 and/or second die 208 can include any number of dies (e.g., 1, 2, 3, 4, 5, 6, 7, 8, 9, 10, or more dies). The first die 204 and/or the second die 208 can be directly bonded without an intervening adhesive to the carrier 202. In some implementations, the protocol switch circuitry 212 can convert second communication protocol to the first communication protocol. The first communication circuitry 206 can receive the communication signal from the protocol switch circuitry 212. The second die 208 can transmit the communication signal to the protocol switch circuitry 212. In some implementations, the bonded structure can also include one or more traces 234 that electrically connect the first die 204 and the second die 208 to the protocol switch circuitry 212.

The protocol switch circuitry 212 can include the processing circuitry 214 to convert the first communication protocol to the second communication protocol. The processing circuitry 214 can be adjacent the first surface 202*a* of the carrier 202 or anywhere within the die containing the protocol switch circuitry 212. The protocol switch circuitry 212 can also convert the first communication protocol to a plurality of communication protocols. Additionally or alternatively, the protocol switch circuitry 212 can convert the plurality of communication protocols to the first communication protocol. In some implementations, the protocol switch circuitry 212 can convert the plurality of communication protocols to a second plurality of communication protocols.

The protocol switch circuitry 212 can also include memory circuitry 216 to store various communication protocols such as the first communication protocol, the second communication protocol, the first plurality of communication protocols, and/or the second plurality of communication protocols. The memory circuitry 216 can be adjacent the first surface 202*a* of the carrier 202 or anywhere within the die of FIG. 3A and/or substrate of FIG. 3B containing the protocol switch circuitry 212. A format of the first communication protocol and/or the second communication protocol can be based on at least one of architecture, data rate, number of input/output interconnects, voltages, clock speed, power, latency, bit error rate, or channel loss. In some implementations, the architecture can include serial architecture and/or parallel architecture. The protocol switch circuitry 212 detects the format of the first communication signal and/or a format of the second communication signal at different times. For example, the protocol switch circuitry 212 can detect a format of the format of the first communication protocol and/or the format of the second communication protocol during an initial powering on state. In other implementations, the protocol switch circuitry 212 can detect the format of the first and/or second communication protocol upon receiving the first and/or second communication protocol.

Figure 5:
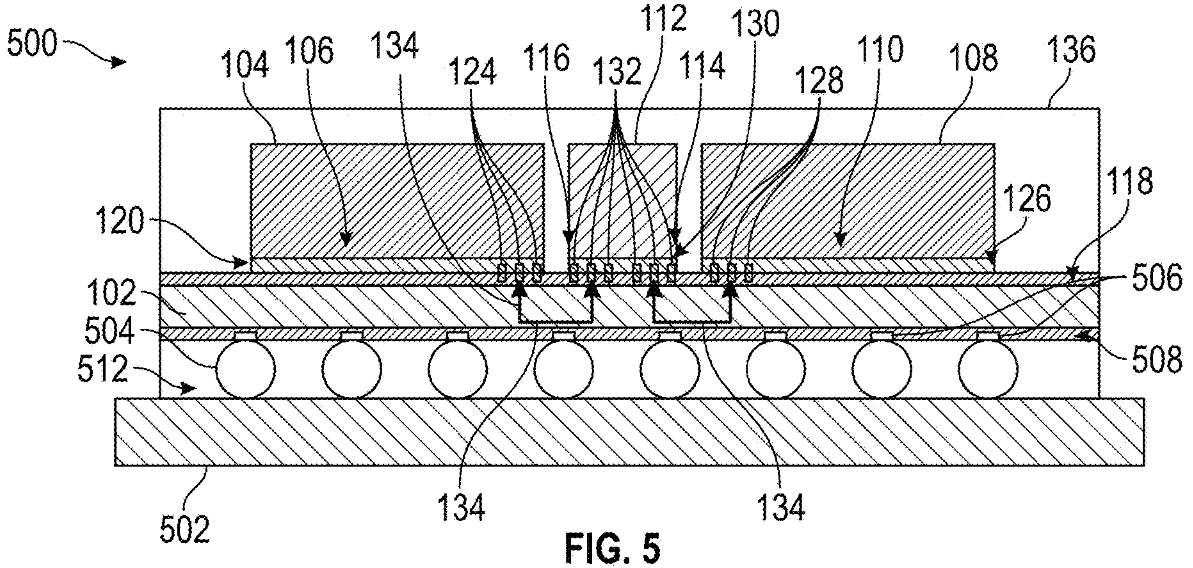
FIG. 5 illustrates the bonded structure of FIG. 2 connected to a carrier.

FIG. 5 illustrates the bonded structure 100 of FIG. 2 in bonded to a second carrier 502, but any of the bonded structures mentioned herein can be bonded to the second carrier 502. Unless otherwise noted, the components in FIG. 5 may be the same as or generally similar to like-numbered components of FIG. 2. As shown in FIG. 5, the bonded structure 100, including the carrier 102, first die 104, second die 108, and protocol switch die 112, can be further electrically and mechanically connected to the second carrier 502 to form a package assembly 500. In some implementations, the carrier 102, first die 104, second die 108, and protocol switch die 112 can be connected to the second carrier 502 by way of a plurality of solder balls 504 or other conductive adhesive. In other implementations (e.g., implementations in which the external device comprises another die, interposer, or wafer), the bonded structure 100 of FIG. 2 can be directly bonded to an external device. The carrier 102 can have corresponding conductive contact pads 506 to provide an electrical connection to another element. The contact pads 506 can include discrete conductive pads disposed in a respective nonconductive field region 508 (e.g., a nonconductive bonding layer). Once connected, an underfill material 512 can be applied around the solder balls 504. The underfill material 512 can include an insulating material that isolates the solder balls 504 from one another and connects the second carrier 502 to the bonded structure 100.

In some implementations, the second carrier 502 can further comprise conductive bumps or solder balls 504 to connect the second carrier 502 to an external device (such as a system board or other device). In some implementations, the carrier 102, first die 104, second die 108, and protocol switch die 112 can be at least partially encapsulated in an encapsulating material 136, which include an organic dielectric (e.g., a polymer such as a molding compound), or an inorganic dielectric (such as silicon oxide, etc.).

Various implementations disclosed herein relate to directly bonded structures in which two or more elements can be directly bonded to one another without an intervening adhesive. In some embodiments, direct bonding can involve bonding of a single material on one element and a single material on the other element, where the single materials on the different elements may or may not be the same. Direct bonding can also involve bonding of multiple materials on one element to multiple materials on the other element (e.g., hybrid bonding).

Figure 6A:
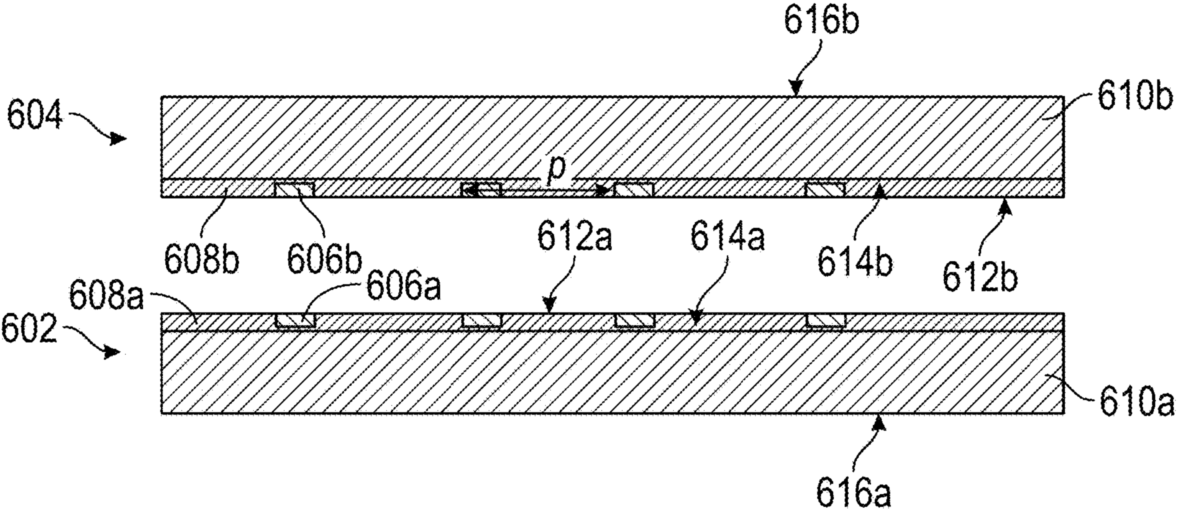
FIG. 6A is a schematic cross-sectional side view of two elements prior to direct hybrid bonding.
Figure 6B:
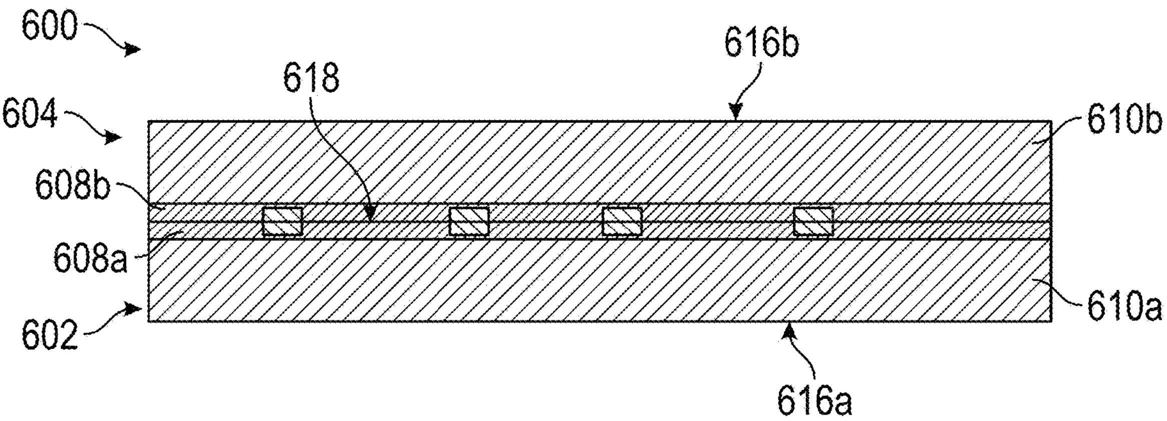
FIG. 6B is a schematic cross-sectional side view of a bonded structure including the two elements shown in FIG. 6A after direct hybrid bonding.

FIGS. 6A and 6B schematically illustrate a process for forming a hybrid bonded structure without an intervening adhesive (which may sometimes be referred to as a "direct hybrid bonded structure") according to some implementations. As used herein, the term "hybrid bonding" refers to a species of direct bonding in which there are both i) nonconductive features directly bonded to nonconductive features, and ii) conductive features directly bonded to conductive features. In FIGS. 6A and 6B, a bonded structure 600 comprises two elements 602 and 604 that can be directly bonded to one another at a bond interface 618 without an intervening adhesive. Two or more microelectronic elements 602 and 604 (such as semiconductor elements, including, for example, integrated device dies, wafers, passive devices, individual active devices such as power switches, etc.) may be stacked on or bonded to one another to form the bonded structure 600. Conductive features 606*a* (e.g., contact pads, exposed ends of vias (e.g., TSVs), or a through substrate electrodes) of a first element 602 may be electrically connected to corresponding conductive features 606*b* of a second element 604. Any suitable number of elements can be stacked in the bonded structure 600. For example, a third element (not shown) can be stacked on the second element 604, a fourth element (not shown) can be stacked on the third element, and so forth. Additionally or alternatively, one or more additional elements (not shown) can be stacked laterally adjacent one another along the first element 602. In some implementations, the laterally stacked additional element may be smaller than the second element. In some implementations, the laterally stacked additional element may be two times smaller than the second element.

In some implementations, the elements 602 and 604 are directly bonded to one another without an intervening adhesive. In various implementations, a non-conductive field region that includes a non-conductive or dielectric material can serve as a first bonding layer 608*a* of the first element 602 which can be directly bonded to a corresponding non-conductive field region that includes a non-conductive or dielectric material serving as a second bonding layer 608*b* of the second element 604 without an intervening adhesive. The non-conductive bonding layers 608*a* and 608*b* can be disposed on respective front sides 614*a* and 614*b* of device portions 610*a* and 610*b*, such as a semiconductor (e.g., silicon) portion of the elements 602, 604. Active devices and/or circuitry can be patterned and/or otherwise disposed in or on the device portions 610*a* and 610*b*. Active devices and/or circuitry can be disposed at or near the front sides 614*a* and 614*b* of the device portions 610*a* and 610*b*, and/or at or near opposite backsides 616*a* and 616*b* of the device portions 610*a* and 610*b*. Bonding layers can be provided on front sides and/or back sides of the elements. The non-conductive material can be referred to as a non-conductive bonding region or bonding layer 608*a* of the first element 602. In some implementations, the non-conductive bonding layer 608*a* of the first element 602 can be directly bonded to the corresponding non-conductive bonding layer 608*b* of the second element 604 using dielectric-to-dielectric bonding techniques. For example, non-conductive or dielectric-to-dielectric bonds may be formed without an intervening adhesive using the direct bonding techniques disclosed at least in U.S. Pat. Nos. 9,664,414; 9,391,143; and 10,434,749, the entire contents of each of which are incorporated by reference herein in their entirety and for all purposes. It should be appreciated that in various implementations, the bonding layers 608*a* and/or 608*b* can comprise a non-conductive material such as a dielectric material, such as silicon oxide, or an undoped semiconductor material, such as undoped silicon. Suitable dielectric bonding surface or materials for direct bonding include but are not limited to inorganic dielectrics, such as silicon oxide, silicon nitride, or silicon oxynitride, or can include carbon, such as silicon carbide, silicon oxycarbonitride, low K dielectric materials, SiCOH dielectrics, silicon carbonitride or diamond-like carbon or a material comprising a diamond surface. Such carbon-containing ceramic materials can be considered inorganic, despite the inclusion of carbon. In some implementations, the dielectric materials do not comprise polymer materials, such as epoxy, resin or molding materials.

In some implementations, the device portions 610*a* and 610*b* can have a significantly different coefficients of thermal expansion (CTEs) defining a heterogenous structure. The CTE difference between the device portions 610*a* and 610*b*, and particularly between bulk semiconductor, typically single crystal portions of the device portions 610*a*, 610*b*, can be greater than 5 ppm or greater than 10 ppm. For example, the CTE difference between the device portions 610*a* and 610*b* can be in a range of 5 ppm to 100 ppm, 5 ppm to 40 ppm, 10 ppm to 100 ppm, or 10 ppm to 40 ppm. In some implementations, one of the device portions 610*a* and 610*b* can comprise optoelectronic single crystal materials, including perovskite materials, that are useful for optical piezoelectric or pyroelectric applications, and the other of the device portions 610*a*, 610*b* comprises a more conventional substrate material. For example, one of the device portions 610*a*, 610*b* comprises lithium tantalate (LiTaO3) or lithium niobate (LiNbO3), and the other one of the device portions 610*a*. 610*b* comprises silicon (Si), quartz, fused silica glass, sapphire, or a glass. In other implementations, one of the device portions 610*a* and 610*b* comprises a III-V single semiconductor material, such as gallium arsenide (GaAs) or gallium nitride (GaN), and the other one of the device portions 610*a* and 610*b* can comprise a non-III-V semiconductor material, such as silicon (Si), or can comprise other materials with similar CTE, such as quartz, fused silica glass, sapphire, or a glass.

In various implementations, direct hybrid bonds can be formed without an intervening adhesive. For example, nonconductive bonding surfaces 612*a* and 612*b* can be polished to a high degree of smoothness. The nonconductive bonding surfaces 612*a* and 612*b* can be polished using, for example, chemical mechanical polishing (CMP). The roughness of the polished bonding surfaces 612*a* and 612*b* can be less than 30 Å rms. For example, the roughness of the bonding surfaces 612*a* and 612*b* can be in a range of about 0.1 Å rms to 15 Å rms. 0.5 Å rms to 10 Å rms, or 1 Å rms to 5 Å rms. The bonding surfaces 612*a* and 612*b* can be cleaned and exposed to a plasma and/or etchants to activate the surfaces 612*a* and 612*b*. In some implementations, the surfaces 612*a* and 612*b* can be terminated with a species after activation or during activation (e.g., during the plasma and/or etch processes). Without being limited by theory, in some implementations, the activation process can be performed to break chemical bonds at the bonding surfaces 612*a* and 612*b*, and the termination process can provide additional chemical species at the bonding surfaces 612*a* and 612*b* that improves the bonding energy during direct bonding. In some implementations, the activation and termination are provided in the same step, e.g., a plasma to activate and terminate the surfaces 612*a* and 612*b*. In other implementations, the bonding surfaces 612*a* and 612*b* can be terminated in a separate treatment to provide the additional species for direct bonding. In various implementations, the terminating species can comprise nitrogen. For example, in some implementations, the bonding surface(s) 612*a*, 612*b* can be exposed to a nitrogen-containing plasma. Further, in some implementations, the bonding surfaces 612*a* and 612*b* can be exposed to fluorine. For example, there may be one or multiple fluorine peaks at or near a bond interface 618 between the first and second elements 602, 604. Thus, in the directly bonded structure 600, the bond interface 618 between two non-conductive materials (e.g., the bonding layers 608*a* and 608*b*) can comprise a very smooth interface with higher nitrogen content and/or fluorine peaks at the bond interface 618. Additional examples of activation and/or termination treatments may be found throughout U.S. Pat. Nos. 9,664,414; 9,391,143; and 10,434,749, the entire contents of each of which are incorporated by reference herein in their entirety and for all purposes. The roughness of the polished bonding surfaces 612*a* and 612*b* can be slightly rougher (e.g., about 1 Å rms to 30 Å rms, 3 Å rms to 20 Å rms, or possibly rougher) after an activation process.

In various implementations, conductive features 606*a* of the first element 602 can also be directly bonded to corresponding conductive features 606*b* of the second element 604. For example, a direct hybrid bonding technique can be used to provide conductor-to-conductor direct bonds along the bond interface 618 that includes covalently direct bonded non-conductive-to-non-conductive (e.g., dielectric-to-dielectric) surfaces, prepared as described above. In various implementations, the conductor-to-conductor (e.g., conductive feature 606*a* to conductive feature 606*b*) direct bonds and the dielectric-to-dielectric hybrid bonds can be formed using the direct bonding techniques disclosed at least in U.S. Pat. Nos. 9,716,033 and 9,652,988, the entire contents of each of which are incorporated by reference herein in their entirety and for all purposes. In direct hybrid bonding implementations described herein, conductive features are provided within non-conductive bonding layers, and both conductive and nonconductive features are prepared for direct bonding, such as by the planarization, activation and/or termination treatments described above. Thus, the bonding surface prepared for direct bonding includes both conductive and non-conductive features.

For example, non-conductive (e.g., dielectric) bonding surfaces 612*a*, 612*b* (e.g., inorganic dielectric surfaces) can be prepared and directly bonded to one another without an intervening adhesive as explained above. Conductive contact features (e.g., conductive features 606*a* and 606*b* which may be at least partially surrounded by non-conductive dielectric field regions within the bonding layers 608*a*, 608*b*) may also directly bond to one another without an intervening adhesive. In various implementations, the conductive features 606*a*, 606*b* can comprise discrete pads or traces at least partially embedded in the non-conductive field regions. In some implementations, the conductive contact features can comprise exposed contact surfaces of through substrate vias (e.g., through silicon vias (TSVs)). In some implementations, the respective conductive features 606*a* and 606*b* can be recessed below exterior (e.g., upper) surfaces (non-conductive bonding surfaces 612*a* and 612*b*) of the dielectric field region or non-conductive bonding layers 608*a* and 608*b*, for example, recessed by less than 30 nm, less than 20 nm, less than 15 nm, or less than 10 nm, for example, recessed in a range of 2 nm to 20 nm, or in a range of 4 nm to 10 nm. In various implementations, prior to direct bonding, the recesses in the opposing elements can be sized such that the total gap between opposing contact pads is less than 15 nm, or less than 10 nm. The non-conductive bonding layers 608*a* and 608*b* can be directly bonded to one another without an adhesive at room temperature in some implementations and, subsequently, the bonded structure 600 can be annealed. Upon annealing, the conductive features 606*a* and 606*b* can expand and contact one another to form a metal-to-metal direct bond. Beneficially, the use of Direct Bond Interconnect, or DBI®, techniques commercially available from Adeia of San Jose, CA, can enable high density of conductive features 606*a* and 606*b* to be connected across the direct bond interface 618 (e.g., small or fine pitches for regular arrays). In some implementations, the pitch of the conductive features 606*a* and 606*b*, such as conductive traces embedded in the bonding surface of one of the bonded elements, may be less than 100 microns or less than 10 microns or even less than 2 microns. For some applications, the ratio of the pitch of the conductive features 606*a* and 606*b* to one of the dimensions (e.g., a diameter) of the bonding pad is less than is less than 20, or less than 10, or less than 5, or less than 3 and sometimes desirably less than 2. In other applications, the width of the conductive traces embedded in the bonding surface of one of the bonded elements may range between 0.3 to 20 microns, e.g., in a range of 0.3 to 3 microns. In various implementations, the conductive features 606*a* and 606*b* and/or traces can comprise copper or copper alloys, although other metals may be suitable. For example, the conductive features disclosed herein, such as the conductive features 606*a* and 606*b*, can comprise fine-grain metal (e.g., a fine-grain copper).

Thus, in direct bonding processes, a first element 602 can be directly bonded to a second element 604 without an intervening adhesive. In some arrangements, the first element 602 can comprise a singulated element, such as a singulated integrated device die. In other arrangements, the first element 602 can comprise a carrier or substrate (e.g., a wafer) that includes a plurality (e.g., tens, hundreds, or more) of device regions that, when singulated, form a plurality of integrated device dies. Similarly, the second element 604 can comprise a singulated element, such as a singulated integrated device die. In other arrangements, the second element 604 can comprise a carrier or substrate (e.g., a wafer). The implementations disclosed herein can accordingly apply to wafer-to-wafer (W2W), die-to-die (D2D), or die-to-wafer (D2W) bonding processes. In wafer-to-wafer (W2W) processes, two or more wafers can be directly bonded to one another (e.g., direct hybrid bonded) and singulated using a suitable singulation process. After singulation, side edges of the singulated structure (e.g., the side edges of the two bonded elements) may be substantially flush and may include markings indicative of the common singulation process for the bonded structure (e.g., saw markings if a saw singulation process is used).

As explained herein, the first and second elements 602 and 604 can be directly bonded to one another without an adhesive, which is different from a deposition process and results in a structurally different interface compared to a deposition. In one application, a width of the first element 602 in the bonded structure is similar to a width of the second element 604. In some other implementations, a width of the first element 602 in the bonded structure 600 is different from a width of the second element 604. Similarly, the width or area of the larger element in the bonded structure may be at least 10% larger than the width or area of the smaller element. The first and second elements 602 and 604 can accordingly comprise non-deposited elements. Further, directly bonded structures 600, unlike deposited layers, can include a defect region along the bond interface 618 in which nanometer-scale voids (nanovoids) are present. The nanovoids may be formed due to activation of the bonding surfaces 612*a* and 612*b* (e.g., exposure to a plasma). As explained above, the bond interface 618 can include concentration of materials from the activation and/or last chemical treatment processes. For example, in implementations that utilize a nitrogen plasma for activation, a nitrogen peak can be formed at the bond interface 618. The nitrogen peak can be detectable using secondary ion mass spectroscopy (SIMS) techniques. In various implementations, for example, a nitrogen termination treatment (e.g., exposing the bonding surface to a nitrogen-containing plasma) can replace OH groups of a hydrolyzed (OH-terminated) surface with NH2 molecules, yielding a nitrogen-terminated surface. In implementations that utilize an oxygen plasma for activation, an oxygen peak can be formed at the bond interface 618. In some implementations, the bond interface 618 can comprise silicon oxynitride, silicon oxycarbonitride, or silicon carbonitride. As explained herein, the direct bond can comprise a covalent bond, which is stronger than van Der Waals bonds. The bonding layers 608*a* and 608*b* can also comprise polished surfaces that are planarized to a high degree of smoothness.

In various implementations, the metal-to-metal bonds between the conductive features 606*a* and 606*b* can be joined such that metal grains grow into each other across the bond interface 618. In some implementations, the metal is or includes copper, which can have grains oriented along the 611 crystal plane for improved copper diffusion across the bond interface 618. In some implementations, the conductive features 606*a* and 606*b* may include nanotwinned copper grain structure, which can aid in merging the conductive features during anneal. The bond interface 618 can extend substantially entirely to at least a portion of the bonded conductive features 606*a* and 606*b*, such that there is substantially no gap between the non-conductive bonding layers 608*a* and 608*b* at or near the bonded conductive features 606*a* and 606*b*. In some implementations, a barrier layer may be provided under and/or laterally surrounding the conductive features 606*a* and 606*b* (e.g., which may include copper). In other implementations, however, there may be no barrier layer under the conductive features 606*a* and 606*b*, for example, as described in U.S. Pat. No. 11,195,748, which is incorporated by reference herein in its entirety and for all purposes.

Beneficially, the use of the hybrid bonding techniques described herein can enable extremely fine pitch between adjacent conductive features 606*a* and 606*b*, and/or small pad sizes. For example, in various implementations, the pitch p (e.g., the distance from edge-to-edge or center-to-center, as shown in FIG. 6A) between adjacent conductive features 606*a* (or 606*b*) can be in a range of 0.5 microns to 50 microns, in a range of 0.75 microns to 25 microns, in a range of 1 micron to 25 microns, in a range of 1 micron to 10 microns, or in a range of 1 micron to 5 microns. Further, a major lateral dimension (e.g., a pad diameter) can be small as well, e.g., in a range of 0.25 microns to 30 microns, in a range of 0.25 microns to 5 microns, or in a range of 0.5 microns to 5 microns.

As described above, the non-conductive bonding layers 608*a*, 608*b* can be directly bonded to one another without an adhesive and, subsequently, the bonded structure 600 can be annealed. Upon annealing, the conductive features 606*a*, 606*b* can expand and contact one another to form a metal-to-metal direct bond. In some implementations, the materials of the conductive features 606*a*, 606*b* can interdiffuse during the annealing process.

Unless the context clearly requires otherwise, throughout the description and the claims, the words "comprise," "comprising." "include," "including" and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Likewise, the word "connected", as generally used herein, refers to two or more elements that may be either directly connected, or connected by way of one or more intermediate elements. Additionally, the words "herein," "above," "below." and words of similar import, when used in this application, shall refer to this application as a whole and not to any particular portions of this application. Moreover, as used herein, when a first element is described as being "on" or "over" a second element, the first element may be directly on or over the second element, such that the first and second elements directly contact, or the first element may be indirectly on or over the second element such that one or more elements intervene between the first and second elements. Where the context permits, words in the above Detailed Description using the singular or plural number may also include the plural or singular number, respectively. The word "or" in reference to a list of two or more items, that word covers all of the following interpretations of the word: any of the items in the list, all of the items in the list, and any combination of the items in the list.

Moreover, conditional language used herein, such as, among others, "can," "could," "might," "may," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments.

While certain embodiments have been described, these embodiments have been presented by way of example only, and are not intended to limit the scope of the disclosure. Indeed, the novel apparatus, methods, and systems described herein may be embodied in a variety of other forms; furthermore, various omissions, substitutions and changes in the form of the methods and systems described herein may be made without departing from the spirit of the disclosure. For example, while blocks are presented in a given arrangement, alternative embodiments may perform similar functionalities with different components and/or circuit topologies, and some blocks may be deleted, moved, added, subdivided, combined, and/or modified. Each of these blocks may be implemented in a variety of different ways. Any suitable combination of the elements and acts of the various embodiments described above can be combined to provide further embodiments. The accompanying claims and their equivalents are intended to cover such forms or modifications as would fall within the scope and spirit of the disclosure.

Several illustrative examples of testing elements for bonded structures and related systems and methods have been disclosed. Although this disclosure has been described in terms of certain illustrative examples and uses, other examples and other uses, including examples and uses which do not provide all of the features and advantages set forth herein, are also within the scope of this disclosure. Components, elements, features, acts, or steps may be arranged or performed differently than described and components, elements, features, acts, or steps may be combined, merged, added, or left out in various examples. All possible combinations and subcombinations of elements and components described herein are intended to be included in this disclosure. No single feature or group of features is necessary or indispensable.

Certain features that are described in this disclosure in the context of separate implementations may also be implemented in combination in a single implementation. Conversely, various features that are described in the context of a single implementation also may be implemented in multiple implementations separately or in any suitable subcombination. Moreover, although features may be described above as acting in certain combinations, one or more features from a claimed combination may in some cases be excised from the combination, and the combination may be claimed as a subcombination or variation of a subcombination.

Further, while illustrative examples have been described, any examples having equivalent elements, modifications, omissions, and/or combinations are also within the scope of this disclosure. Moreover, although certain aspects, advantages, and novel features are described herein, not necessarily all such advantages may be achieved in accordance with any particular example. For example, some examples within the scope of this disclosure achieve one advantage, or a group of advantages, as taught herein without necessarily achieving other advantages taught or suggested herein. Further, some examples may achieve different advantages than those taught or suggested herein.

Some examples have been described in connection with the accompanying drawings. The figures may or may not be drawn and/or shown to scale, but such scale should not be limiting, since dimensions and proportions other than what are shown are contemplated and are within the scope of the disclosed invention. Distances, angles, etc. are merely illustrative and do not necessarily bear an exact relationship to actual dimensions and layout of the devices illustrated. Components may be added, removed, and/or rearranged. Further, the disclosure herein of any particular feature, aspect, method, property, characteristic, quality, attribute, element, or the like in connection with various examples may be used in all other examples set forth herein. Additionally, any methods described herein may be practiced using any device suitable for performing the recited steps.

For purposes of summarizing the disclosure, certain aspects, advantages and features of the inventions have been described herein. Not all, or any such advantages are necessarily achieved in accordance with any particular example of the inventions disclosed herein. No aspects of this disclosure are essential or indispensable. In many examples, the devices, systems, and methods may be configured differently than illustrated in the figures. or description herein. For example, various functionalities provided by the illustrated modules may be combined, rearranged, added, or deleted. In some implementations, additional or different processors or modules may perform some or all of the functionalities described with reference to the examples described and illustrated in the figures. Many implementation variations are possible. Any of the features, structures, steps, or processes disclosed in this specification may be included in any example.

What is claimed is:

1. A bonded structure comprising:

a carrier;

a first die comprising a first communication circuitry to format a communication signal according to a first communication protocol and to transmit the communication signal, the first die directly bonded to the carrier without an intervening adhesive;

a protocol switch die directly bonded to the carrier without an intervening adhesive, the protocol switch die comprising circuitry to receive the communication signal and to convert the communication signal from the first communication protocol to a second communication protocol, wherein the second communication protocol is different from the first communication protocol, wherein the protocol switch die transmits the communication signal according to the second communication protocol; and a second die comprising a second communication circuitry to receive the communication signal formatted in the second communication protocol, the second die directly bonded to the carrier without an intervening adhesive.

2. The bonded structure of claim 1, wherein the protocol switch die further converts the second communication protocol to the first communication protocol.

3. The bonded structure of claim 1, wherein the first communication circuitry receives the communication signal from the protocol switch die.

4. The bonded structure of claim 1, wherein the second communication circuitry transmits the communication signal.

5. The bonded structure of claim 1, wherein a first nonconductive bonding layer of the carrier is directly bonded to a second nonconductive layer of the first die without an intervening adhesive, and wherein a first contact feature of the carrier is directly bonded to a second contact feature of the first die without an intervening adhesive.

6. The bonded structure of claim 5, wherein the first nonconductive bonding layer of the carrier is directly bonded to a third nonconductive layer of the second die without an intervening adhesive; and wherein the first contact feature of the carrier is directly bonded to a third contact feature of the second die without the intervening adhesive.

7. The bonded structure of claim 5, wherein the first nonconductive bonding layer of the carrier is directly bonded to a fourth nonconductive layer of the protocol switch die without an intervening adhesive; and wherein the first contact feature of the carrier is directly bonded to a fourth contact feature of the protocol switch die without an intervening adhesive.

8. The bonded structure of claim 1, wherein the protocol switch die comprises a multiplexer to receive at least one protocol of a plurality of incoming communication protocols and to convert the at least one protocol of the plurality of incoming communication protocols to at least one protocol of a plurality of outgoing communication protocols based at least on a control input.

9. A bonded structure comprising:

a carrier comprising protocol switch circuitry to convert between a first communication protocol to a second communication protocol;

a first die directly bonded to the carrier without an intervening adhesive, the first die comprising a first communication circuitry to format a communication signal according to the first communication protocol and to transmit the communication signal to the protocol switch circuitry; and a second die directly bonded to the carrier without an intervening adhesive, the second die comprising a second communication circuitry to receive the communication signal formatted according to the second communication protocol from the protocol switch circuitry, wherein the second communication protocol is different from the first communication protocol.

10. The bonded structure of claim 9, wherein the protocol switch circuitry comprises a processing circuitry to convert the first communication protocol to the second communication protocol.

11. The bonded structure of claim 9, wherein the protocol switch circuitry further converts the first communication protocol to a plurality of communication protocols.

12. The bonded structure of claim 11, wherein the protocol switch circuitry further converts the plurality of communication protocols to the first communication protocol.

13. The bonded structure of claim 11, wherein the protocol switch circuitry further converts the plurality of communication protocols to a second plurality of communication protocols.

14. The bonded structure of claim 9, wherein the protocol switch circuitry is embedded within the carrier.

15. The bonded structure of claim 9, wherein the protocol switch circuitry is patterned on the carrier.

16. A bonded structure comprising:

a carrier;

a first integrated device die comprising a first communication circuitry to format a communication signal according to a first communication protocol and to transmit the communication signal, the first integrated device die directly bonded to the carrier without an intervening adhesive;

a second integrated device die disposed in or on the carrier, the second integrated device die comprising protocol switch circuitry to receive the communication signal and to convert the communication signal from the first communication protocol to a second communication protocol, wherein the second communication protocol is different from the first communication protocol, wherein the second integrated device die transmits the communication signal according to the second communication protocol; and a third integrated device die comprising a second communication circuitry to receive the communication signal formatted in the second communication protocol.

17. The bonded structure of claim 16, wherein the second integrated device die further comprises a memory to store various communication protocols.

18. The bonded structure of claim 16, wherein a format of the first communication protocol and a format of the second communication protocol is based on at least one of architecture, data rate, number of input/output interconnects, voltages, clock speed, power, latency, bit error rate, or channel loss.

19. The bonded structure of claim 16, wherein the second integrated device die and the third integrated device die are directly bonded to the carrier without an intervening adhesive.

20. The bonded structure of claim 16, wherein the second integrated device die and the third integrated device die are flip chip bonded to the carrier.

* * * * *